(12) United States Patent  
Sager et al.

(10) Patent No.: US 7,247,346 B1  
(45) Date of Patent: Jul. 24, 2007

(54) COMBINATORIAL FABRICATION AND HIGH-THROUGHPUT SCREENING OF OPTOELECTRONIC DEVICES

(75) Inventors: Brian M. Sager, Palo Alto, CA (US); Martin R. Roscheisen, San Francisco, CA (US); Klaus Petritsch, Foster City, CA (US)

(73) Assignee: Nanosolar, Inc., Palo Alto, CA (US)

( * ) Notice: Subject to any disclaimer, the term of this patent is extended or adjusted under 35 U.S.C. 154(b) by 722 days.

(21) Appl. No.: 10/426,242

(22) Filed: Apr. 28, 2003

Related U.S. Application Data

(60) Provisional application No. 60/407,196, filed on Aug. 28, 2002.

(51) Int. Cl.  
*B05D 5/06* (2006.01)

(52) U.S. Cl. .................. 427/162; 427/256; 427/74; 427/75

(58) Field of Classification Search .............. 427/162, 427/256, 74, 75  
See application file for complete search history.

(56) References Cited

U.S. PATENT DOCUMENTS

| | | | |
|---|---|---|---|
| 5,985,356 A | 11/1999 | Schultz et al. ............. | 427/8 |
| 6,401,519 B1 | 6/2002 | McFarland et al. ......... | 73/24.6 |
| 2002/0105080 A1* | 8/2002 | Speakman .................. | 257/749 |
| 2002/0106873 A1* | 8/2002 | Beck et al. .................. | 438/482 |
| 2003/0068496 A1* | 4/2003 | Wei et al. .................... | 428/402 |

FOREIGN PATENT DOCUMENTS

EP 260 965 1/2002

OTHER PUBLICATIONS

Yunfeng Lu, Rahul Ganguli, Celeste A. Drewien, Mark T. Anderson, C. Jeffrey Brinker, Weilang Gong, Yongxing Guo, Hermes Soyez, Bruce Dunn, Michael H. Huang & Jeffrey I. Zink. 1997. Continuous formation of supported cubic and hexagonal mesoporous films by sol-gel dip-coating. Science 389, 364-368.

Lu, Y., Yang, Y., Sellinger, A., Lu, M., Huang, J., Fan, H., Haddad, R., Lopez, G., Burns, A.R., Sasaki, D.Y., Shelnutt, J., and C. J. Brinker, "Self-Assembly of Mesoscopically Ordered Chromatic Polydiacetylene Nanocomposites", *Nature* 410: 913-917 (2001).

L. Schmidt-Mende, A. Fechtenkotter, K. Mullen, E. Moons, R. H. Friend, J. D. MacKenzie. 2002. Self-Organized Discotic Liquid Crystals for High-Efficiency Organic Photovoltaics. Science 293, 1119-1122.

(Continued)

*Primary Examiner*—Alain L. Bashore  
(74) *Attorney, Agent, or Firm*—Joshua D. Isenberg; JDI Patent

(57) ABSTRACT

Methods and apparatus for the rapid and parallel synthesis of optoelectronic cell devices and for the high-throughput screening of such devices for useful properties are disclosed. The methods comprise the parallel synthesis of arrays of optoelectronic devices fabricated within an addressable sample-holding matrix. Each optoelectronic device is created and tested within an addressable sample-holder in the fabrication device.

32 Claims, 10 Drawing Sheets

OTHER PUBLICATIONS

Wendy U. Huynh, Janke J. Dittmer, A. Paul Alivisatos. 2002. Hybrid Nanorod-PolymerSolar Cells. Science 295, 2425-2427.

Huang Y, Duan, X, Wei, Q, & C.M. Lieber, "Directed Assembly Of One-Dimensional Nanostructures Into Functional Networks" *Science* 291(5504):630-633 (2001).

Andrew A. Gewirth, Panos C. Andricacos, and Jay A. Switzer, with John O. Dukovic, editor "Hot Topics in Electrodeposition", The Electrochemical Society *Interface* Spring 1998.

Byung Hee Hong, Sung Chul Bae, Chi-Wan Lee, Sukmin Jeong, and Kwang S. Kim, "Ultrathin Single-Crystalline Silver Nanowire Arrays Formed in an Ambient Solution Phase", *Science* 294: 348-351; Published online Sep. 6, 2001.

Mapes et al., "Ionic Conductivities of Poly(siloxane) Polymer Electrolytes with Varying Length of Linear Ethoxy Sidechains, Different Molecular Weights, and Mixed Copolymers", *Polymer Preprints*, 41(1), pp. 309-310 (2000).

Justin D. Holmes, Keith P. Johnston, R. Christopher Doty, and Brian A. Korgel, "Control of Thickness and Orientation of Solution-Grown Silicon Nanowires" *Science* 287, Feb. 25, 2000: pp. 1471-1473.

Hooper et al., "A Highly Conductive Solid-State Polymer Electrolyte Based on a Double-Comb Polysiloxane Polymer with Oligo(ethylene oxide) Side Chains", *Organometallics*, vol. 18, No. 17, Aug. 16, 1999.

Heini Saloniemi, "Electrodeposition of PbS, PbSe and PbTe Thin Films" by Heini Saloniemi, *VTT Publications* 423, Dec. 15, 2000.

\* cited by examiner

COMBINATORIAL FABRICATION AND HIGH-THROUGHPUT SCREENING OF OPTOELECTRONIC DEVICES

CROSS-REFERENCE TO RELATED APPLICATION

This application claims priority to U.S. Provisional Patent Application 60/407,196, filed Aug. 28, 2002, the entire disclosures of which are incorporated herein by reference.

FIELD OF THE INVENTION

This invention generally relates to methods and apparatus for the parallel synthesis and screening of an array of optoelectronic devices, and more specifically to the combinatorial fabrication and high-throughput testing of optoelectronic devices.

BACKGROUND OF THE INVENTION

To optimize the efficiency and stability of optoelectronic devices, it is necessary to fabricate devices composed of specific materials and in particular architectural arrangements. The discovery of new materials and structures with novel chemical, optical, electronic, and physical properties can lead to the development of new and useful solar cell devices optimized for particular structures and/or functions Given the large number of potentially useful materials and device structures, the vast majority of possible combinations of specific materials and architectural arrangements in new solar cell device architectures remain largely unexplored and most devices likely remain far from being optimized. However, prototype optoelectronic devices fabricated using current methods are either one-off creations or are created in small batches, which on a per-device basis incur high cost, significant production time, and significant labor associated with both fabrication and testing. As such, there exists a need in the art for more efficient, economical and systematic methods and apparatus for the rapid and parallel synthesis and characterization of novel optoelectronic devices and for the high-throughput screening of such devices for useful and improved properties.

SUMMARY OF THE INVENTION

The disadvantages associated with the prior art are overcome by systematic methods and apparatus for the rapid and parallel synthesis of novel optoelectronic devices and for the high-throughput screening of such devices for useful properties.

Embodiments of the invention include methods and apparatus for fabricating and screening devices. A plurality of devices may be formed on a substrate in an array with each device formed at a uniquely addressable position in the array. The performance of each device in the array may be tested for result-effective parameters. The devices may be fabricated such that at least one result effective parameter is different for two or more devices in the array. Data collected as a result of testing the array devices may be stored in a database containing device screening data. By way of example, and without loss of generality, each of the optoelectronic devices in the array may be a photovoltaic device, such as a solar cell.

In one particular example, among others, a device may be formed at each addressable position by, e.g., sequentially building one or more device layers through process steps such as layer co-deposition (or polymerization, in the case of polymers) in parallel of a conducting dye or polymer film upon the substrate at each addressable position in the array.

An optoelectronic device may be formed at each addressable position e.g., by co-depositing or co-polymerizing in parallel a conducting, semiconducting or insulating polymer film upon the substrate at each addressable position in the array. Each of the devices in the array may be fabricated by forming one or more layers of material on the substrate using one or more dispensers. The dispenser may be moved with respect to the dispenser(s) or the dispenser(s) may be moved with respect to the substrate or both the dispenser(s) and substrate may both move with respect to each other. One or more rows of fully or partially complete optoelectronic devices may be formed with the dispenser in a single pass.

Other examples of techniques that may be used for the fabrication one or more layers of optoelectronic devices include, but are not limited to, parallel solution deposition into a set of surfactant-templated, high-porosity polymeric mold or inorganic mesoporous structures, electrodeposition, and solution deposition, as well as selective layer removal, layer cleaning, drying, curing, doping, and polymerization. Inventive methods for the rapid and parallel testing of prototype optoelectronic devices include, but are not limited to, parallel optoelectronic measurement on a set of prototype optoelectronic devices, data recording for the parallel and/or high-speed serial acquisition of optoelectronic data on each device in the set, and the integration of the optoelectronic device properties, material composition, and device architecture with the associated optoelectronic measurement data.

According to another embodiment of the invention, optoelectronic devices may be screened for result effective parameters. The optoelectronic devices may be formed on a substrate in an array containing a plurality of such devices with each optoelectronic device is formed at a uniquely addressable position in the array. According to embodiments of this method one or more substrates having fabricated thereon one or more arrays of optoelectronic devices are supported with respect to one or more probes. The probe tests one or more properties of one or more of the optoelectronic devices. Relative movement is imparted between the one or more substrates and the one or more probes to align the one or more probes with a different one or more devices which are then tested with the probe.

According to other embodiments of the present invention optoelectronic devices may be fabricated and screened by forming on a substrate an array containing a plurality of optoelectronic devices, wherein each optoelectronic device is formed at a uniquely addressable position in the array and testing the performance of each optoelectronic device in the array.

DETAILED DESCRIPTION OF THE INVENTION

Contents

I. Glossary

II. General Overview

Figure 1A:
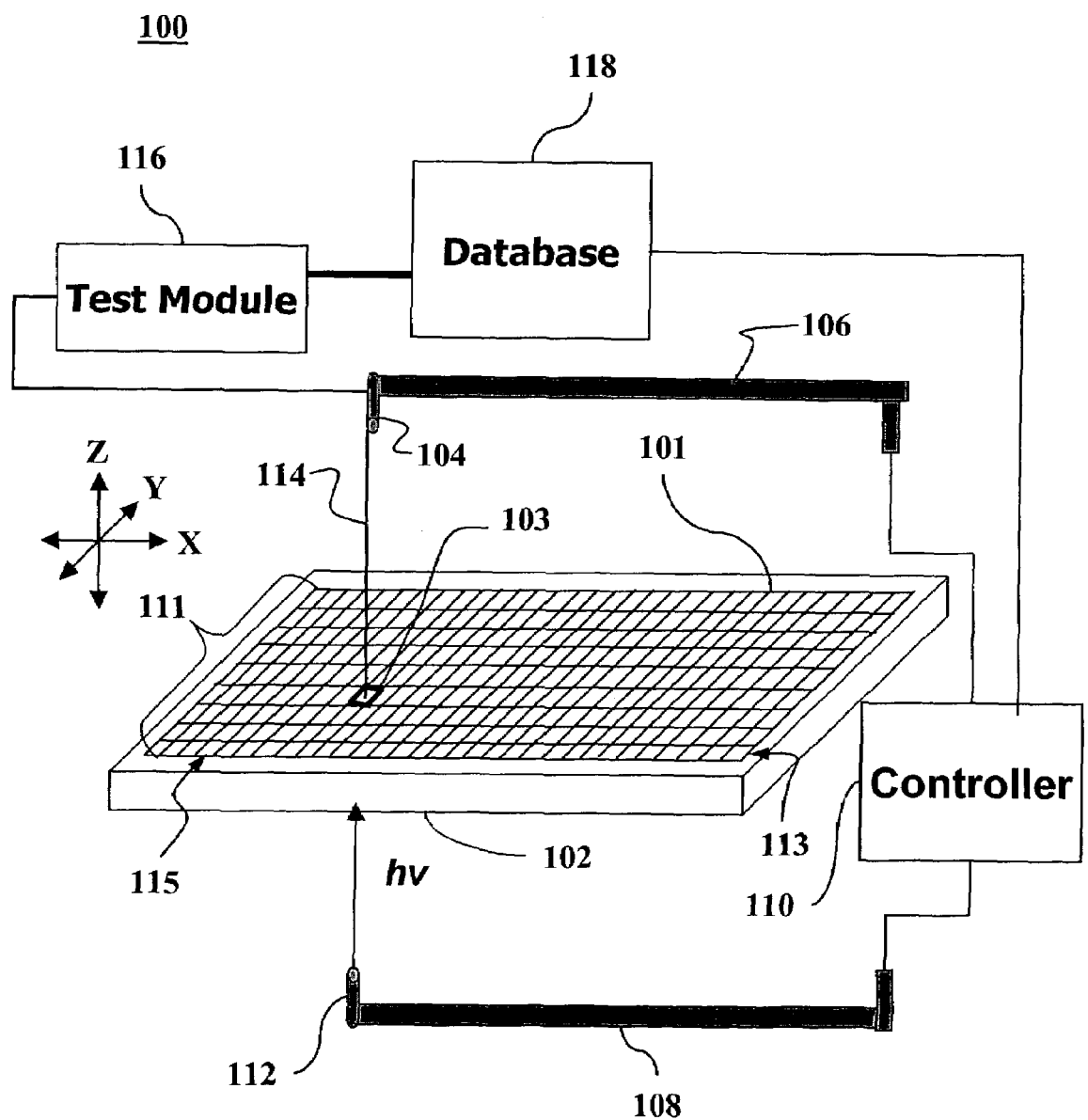
FIGS. 1A-1B depicts an apparatus for screening an array of devices according to an embodiment of the present invention.

III. Fabrication of an Array of Devices

IV. Methods For Delivery Of Reactant Components

V. Moving The Dispenser With Respect To The Substrate

VI. Synthetic Routes For Reacting The Array Of Components

VII. Methods For Screening An Array Of Devices

VIII. Alternative Embodiments

X. Conclusion

I. GLOSSARY

The following terms are intended to have the following general meanings as they are used herein:

Combinatorial Chemistry: In general, combinatorial chemistry refers to the approach of creating vast numbers of compounds by reacting a set of starting chemicals in a variety of different possible combinations.

Device: An assembly or sub-assembly having two or more layers of material.

Optoelectronic Device: A device that interacts with radiation and electric current. Such a device could be a light-emitting device, e.g. an LED or laser, or a light absorbing device, e.g. a photodetector/counter or photovoltaic cell (solar cell).

Solar Cell: A photovoltaic device that interacts with radiation (often in the form of sunlight) impinging on the device to produce electric power or voltage.

Organic Solar Cell: A type of solar cell wherein an active photoelectric layer is fabricated, either partly or entirely, using organic materials comprising, e.g., polymers, dyes, pigments (including mixtures) that are predominantly carbon based compounds. These materials may be insulating, conductive or semiconductive.

Active Layer: The layer of material in an optoelectronic device that interacts with radiation or electrical signals to produce a desired effect. In the example of a photovoltaic device, the active layer typically interacts with radiation to produce electron hole pairs.

Array: An arrangement of two or more locations that are in a known spatial relation with respect to each other according to a predetermined pattern.

Addressable Position: As used herein with respect to an array, an "addressable position" generally refers to a location within the array that may be readily identified so that device fabrication or device testing steps may be performed there.

Substrate: A material that provides a rigid or semi-rigid support surface for two or more devices. The Substrate may be substantially flat or may have a rough surface area, e.g. a mesoporous surface with gaps of 1-100 nm in order to increase the surface area, e.g. for better light absorption. In some embodiments it may be desirable to physically separate regions of the substrate for different devices with, for example, dimples, wells, raised regions, etched trenches, or the like. In some embodiments, the substrate itself contains wells, raised regions, etched trenches, etc. which form all or part of the device regions.

Base Layer: A layer of material having surface that provides a support structure upon which additional layers of an individual device may be fabricated. The base layer may be transparent and/or can also provide protection functions such as UV-filtering, oxygen and water shielding, and mechanical protection. The base layer may be part of the substrate or may be a separate layer formed the substrate.

Predefined Region: A predefined region is a localized area on a substrate which is, was, or is intended to be used for formation of a selected device and is otherwise referred to herein in the alternative as "known" region, "reaction" region, a "selected" region, or simply a "region." The predefined region may have any convenient shape, e.g., circular, rectangular, elliptical, wedge-shaped, etc. Additionally, the predefined region, i.e., the reaction site, can be a bead or pellet which is coated with a reactant component(s) of interest. In this embodiment, the bead or pellet can be identified with a tag, such as an etched binary bar code or co-applied radio-frequency tag that can be used to indicate the history of the bead or pellet, i.e., to identify which components were deposited thereon. In some embodiments, a predefined region and, therefore, the area upon which each distinct material is synthesized is smaller than about 25 $cm^2$, preferably less than 10 $cm^2$, more preferably less than 5 $cm^2$, even more preferably less than 1 $cm^2$, still more preferably less than 1 $mm^2$, and even more preferably less than 0.5 $mm^2$.

Radiation: Energy which may be selectively applied including energy having a wavelength between $10^{-14}$ and $10^4$ meters including, for example, electron beam radiation, gamma radiation, x-ray radiation, ultraviolet radiation, visible light, infrared radiation, microwave radiation and radio waves. "Irradiation" refers to the application of radiation to a surface.

Component: "Component" is used herein to refer to each of the individual chemical substances that act upon one another to produce a particular material and is otherwise referred to herein in the alternative as "reactant" or "reactant component." That is to say, the components or, alternatively, reactants are the molecules that act upon one another to produce a new molecule(s), i.e., product(s); for example, in the reaction HCl+NaOH.fwdarw.NaCl+$H_2$O, the HCl and the NaOH are the components or reactants.

Material: The term "material" is used herein to refer to solid-state compounds, extended solids, extended solutions, clusters of molecules or atoms, crystals, polymers, dyes, particularly including conjugated polymers and dyes.

Covalent Network Solids: Solids that consist of atoms held together in a large network of chains by covalent bonds. Such covalent network solids include, but are not limited to, diamond, silicon nitride, graphite, bunkmisterfullerene ($C_{60}$) and organic polymers which cannot be synthesized in a stepwise fashion.

Interpenetrating Networks: Networks that are formed by mixing different organic compounds (e.g., polymers or dyes)

in solution. After evaporation of the solvent the compounds phase segregate and can form phases (clusters) of one compound which are partly or fully interconnected while forming a large interface area with a second compound.

Ionic Solids: Solids which can be modeled as cations and anions held together by electrical attraction of opposite charge. Such ionic solids include, but are not restricted to, $CaF_2$, $CdCl_2$, $ZnCl_2$, $NaCl_2$, $AgF$, $AgCl$, $AgBr$ and spinels (e.g., $ZnAl_2O_4$, $MgAl_2O_4$, $FrCr_2O_4$, etc.).

Molecular Solids: Solids consisting of atoms or molecules held together by intermolecular forces. Molecular solids include, but are not limited to, extended solids, solid neon, organic compounds, synthetic or organic metals (e.g., tetrathiafulvalene-tetracyanoquinonedimethae (TTF-TCNQ)), liquid crystals (e.g., cyclic siloxanes) protein crystals, conjugated polymers and dyes.

Inorganic Materials: Materials which do not contain carbon as a principal element. The oxides and sulphides of carbon and the metallic carbides are considered inorganic materials. Examples of inorganic compounds which can be synthesized using the methods of the present invention include, but are not restricted to, the following:

(a) Intermetallics (or Intermediate Constituents): Intermetallic compounds constitute a unique class of metallic materials that form long-range ordered crystal structures below a critical temperature. Such materials form when atoms of two metals combine in certain proportions to form crystals with a different structure from that of either of the two metals (e.g., NiAl, $CrBe_2$, CuZn, etc.).

(b) Metal Alloys: A substance having metallic properties and which is composed of a mixture of two or more chemical elements of which at least one is a metal.

(c) Magnetic Alloys: An alloy exhibiting ferromagnetism such as silicon iron, but also iron-nickel alloys, which may contain small amounts of any of a number of other elements (e.g., copper, aluminum, chromium, molybdenum, vanadium, etc.), and iron-cobalt alloys.

(d) Ceramics: Typically, a ceramic is a metal oxide, boride, carbide, nitride, or a mixture of such materials. In addition, ceramics are inorganic, nonmetallic products that are subjected to high temperatures (i.e., above visible red, 540° C. to 1000° C.) during manufacture or use. Such materials include, for example, alumina, zirconium, silicon carbide, aluminum nitride, silicon nitride, the $YBa_2Cu_3O_{7-8}$ superconductor, ferrite ($BaFe_{12}O_{19}$), Zeolite A ($Na_{12}[(SiO_{212}(AlO_2)]27H_2O$), soft and permanent magnets, etc. High temperature superconductors are illustrative of materials that can be formed and screened using the present invention. "High temperature superconductors" include, but are not restricted to, the $La_{2-x}Sr_xCuO_4$ superconductors, the $Bi_2CaSr_2Cu_2O_{8+x}$ superconductors, the $Ba_{1-x}K_xBiO_3$ superconductors and the ReBaCu superconductors. Such high temperature superconductors will, when they have the desired properties, have critical temperatures above 30 K., preferably above 50 K., and more preferably above 70 K, where K represents the Kelvin unit of temperature.

(e) Inorganic polymers such as polysilanes or other noncarbon based polymers or monomers.

Organic Materials: Compounds, which generally consist of carbon and hydrogen, with or without oxygen, nitrogen or other elements, except those in which carbon does not play a critical role (e.g., carbonate salts). Examples of organic materials which can be synthesized using the methods of the present invention include, but are not restricted to, the following:

(a) Non-biological, organic polymers: Nonmetallic materials consisting of large macromolecules composed of many repeating units. Such materials can be either natural or synthetic, cross-linked or non-crosslinked, and they may be homopolymers, copolymers, or higher-ordered polymers (e.g., terpolymers, etc.). By "non-biological," α-amino acids and nucleotides are excluded. More particularly, "non-biological, organic polymers" exclude those polymers which are synthesized by a linear, stepwise coupling of building blocks. Examples of polymers which can be prepared using the methods of the present invention include, but are not limited to, the following: polyurethanes, polyesters, polycarbonates, polyethyleneimines, polyacetates, polystyrenes, polyamides, polyanilines, polyacetylenes, polypyrroles, conjugate polymers, (e.g., semiconductive or conductive polymers such as polyphenylvinylene, polythiophene, polyfluorenes, polyparaphenylene and polymers containing $C_{60}$ or dyes such as perylenes or phthalocyanines) or conductive polymers such as doped PEDOT (Rayfron) or polyanyline. These may be synthesized or grafted onto one another using either classical organic chemistry techniques or using enzymes to catalyze specific reactions.

(b) Organic Dyes and pigments such as derivatives of perylenes, phthalocyanines, merocyanines, terylenes and squarines.

Composite Materials: Any combination of two materials differing in form or composition on a macroscale. The constituents of composite materials retain their identities, i.e., they do not dissolve or merge completely into one another although they act in concert. Such composite materials may be inorganic, organic or a combination thereof. Included within this definition are, for example, doped materials, dispersed metal catalysts and other heterogeneous solids.

II. GENERAL OVERVIEW

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

The inventors have adapted techniques originally developed for the pharmaceutical industry to applications in the design and testing of electronic and optoelectronic devices. Although such techniques have been applied to the synthesis and characterization of materials deposited on a substrate, (see e.g., U.S. Pat. Nos. 5,985,356 to Schultz et al and 6,401,519 to McFarland et al.) the inventors are aware of no application of such techniques to characterization of electronic devices, photonic devices, photovoltaic devices such as solar cell devices, or other optoelectronic devices.

In embodiments of the present invention, combinatorial chemistry techniques may be used to fabricate an array of two or more devices on a common substrate. Each device is fabricated at a known location on the substrate. Each device may be made from two or more different layers of material. Combinatorial chemistry techniques may be used to vary the properties of one or more of the different layers in each device in the array. Once the devices are fabricated, they may be tested.

The present invention provides methods and apparatus for the preparation and use of a substrate having an array of devices in predefined regions thereon. The invention is described herein primarily with regard to the preparation of optoelectronic devices, but can readily be applied in the fabrication and testing of other devices. Devices that can be prepared in accordance with the methods of the present invention include, but are not limited to, electronic devices such as transistors, diodes, resistors, capacitors, inductors, photonic devices and optoelectronic devices, such as solar cells, light emitting diodes, tunable lasers, lighting systems, and integrated circuits involving two or more of the preceding. Furthermore, the techniques described herein may be readily applied to devices that take advantage of spatial scale such as filters chemical delivery agents and drug delivery agents, catalysts, and storage devices including fuel cells. In particular embodiment described herein, devices that can be prepared in accordance with the methods of the present invention include, but are not limited to, optoelectronic devices including organic, inorganic and hybrid solar cell devices.

The resulting Substrate having an array of devices thereon will have a variety of uses. For example, once prepared, the Substrate can be screened for devices having useful properties. Accordingly, the array of devices is preferably synthesized on a single substrate. By synthesizing the array of devices on a single substrate, the array may be more easily screened for devices having useful properties, thereby greatly reducing the time and cost associated with optimizing the parameters of the layers making up the devices.

Properties which can be screened for include, for example, electrical, thermal mechanical, morphological, optical, magnetic, chemical, etc. More particularly, properties which can be screened for include, for example, electrical conductivity, superconductivity, electrical resistivity, thermal conductivity, anisotropy, hardness, crystallinity, current-voltage (I-V) curves, optical transparency, magnetoresistance, permeability, frequency doubling, photoemission, photoelectric efficiency, coercivity, critical current, robustness, reliability, operational lifetime, mean time between failures, photoluminescence, photoluminescence quenching, surface conductivity, optical absorption, surface properties such as profile (structure) roughness, polarity, wetting properties (e.g. adsorption or desorption) or other useful properties which will be apparent to those of skill in the art upon review of this disclosure. Importantly, the synthesizing and screening of a diverse array of devices enables the critical parameter ranges for new devices to be rapidly characterized. Any device found to be optimized can be subsequently prepared on a large-scale. It will be apparent to those of skill in the art that once identified using the methods of the present invention, a variety of different methods can be used to prepare such useful devices on a large or bulk scale with essentially the same structure and performance characteristics.

Generally, the array of devices is formed on a Substrate with each device being formed at a uniquely addressable position in the array corresponding to predefined regions on the Substrate. Each of the devices may be formed in two or more layers. The different layers within an individual device may partially or entirely overlap one another depending on the nature of the device. The components of each layer may be successively delivered to the predefined regions on the Substrate where the components may react to form the desired layer. Each component can be delivered in a uniform, discrete, stepped, or gradient fashion to produce either a single stoichiometry or, alternatively, a large number of stoichiometries within a single predefined region. The ratios of the components of a given layer may vary from device to device in a predetermined fashion such that the devices may have different performance characteristics if the ratios in question are result effective. The devices may be fabricated in a parallel fashion with a given layer being fabricated substantially simultaneously for all the devices in the array. Alternatively, the devices may be fabricated in a serial fashion with one or more layers being deposited for a given device before such layer or layers are deposited for the next device in the array. Alternatively, the devices may be fabricated by some combination of serial and parallel fabrication.

In the methods of the present invention, the components of a given layer, after being delivered to predefined regions on the substrate, can be reacted using a number of different synthetic routes or simply mixed and blended without chemical reaction. For example, the components can be reacted using, for example, solution based synthesis techniques, photochemical techniques, polymerization techniques, photopolymerization, etching, template directed synthesis techniques, epitaxial growth techniques, by the sol-gel process, by thermal, infrared or microwave heating, by calcination, sintering or annealing, by hydrothermal methods, by flux methods, by crystallization through vaporization of solvent, etc. Other useful synthesis techniques that can be used to simultaneously react and/or deposit the components of interest will be readily apparent to those of skill in the art.

If the reactions are conducted in parallel, the number of reaction steps can be minimized. Moreover, the reaction conditions at different reaction regions can be controlled independently. As such, reactant and/or deposition amounts, reactant and/or deposition solvents, reaction and/or deposition temperatures, reaction and/or deposition times, the rates at which the reactions or depositions are quenched, deposition order of reactants, solvent concentration, reactant concentration, presence and concentration of dopants and/or catalysts etc. can be varied from reaction region to reaction region on the substrate. Thus, for example, if a given layer for two different devices is made with first and second components, the first component of the first device and the first component of the second device can be the same or different. If the first component of the first device is the same as the first component of the second device, this component can be offered to the first and second device regions on the Substrate at either the same or different concentrations. This is true as well for the second component for the first device and the second component for the second device, etc. As with the first component of the first and second materials, the second component of the first material and the second component of the second material can be the same or different and, if the same, this component can be offered to the first and second regions on the substrate at either the same or different concentrations. Moreover, within a given predefined region on the substrate, the component can be delivered in either a uniform or gradient fashion. If the same components are delivered to the first and second device regions of the substrate at identical concentrations, then the reaction conditions (e.g., reaction temperatures, reaction times, etc.) under which the reactions are carried out can be varied from reaction region to reaction region.

Moreover, in one embodiment of the present invention, a method is provided for forming at least two different arrays of devices by delivering substantially the same reactant components at substantially identical concentrations to reaction regions on both first and second Substrates and, thereafter, subjecting the devices on the first Substrate to a first set of reaction conditions and the components on the second Substrate to a second set of reaction conditions in a wide array of compositions. Using this method, the effects of the various reaction parameters can be studied and, in turn, optimized.

Reaction parameters which can be varied include, for example, reactant amounts, reactant solvents, solvent concentrations, presence and concentration of catalysts, presence and concentration of dopants, reaction temperatures, reaction times, the pressures at which the reactions are carried out, the atmospheres in which the reactions are conducted, the rates at which the reactions are quenched, the order in which the reactants are deposited, etc. Other reaction parameters which can be varied will be apparent to those of skill in the art.

The reactant components in the individual reaction regions must often be prevented from moving to adjacent reaction regions. Most simply, this can be ensured by leaving a sufficient amount of space between the regions on the substrate so that the various components cannot interdiffuse between reaction regions. Moreover, this can be ensured by providing an appropriate barrier between the various reaction regions on the substrate. In one approach, a mechanical device or physical structure defines the various regions on the substrate. A wall or other physical barrier, for example, can be used to prevent the reactant components in the individual reaction regions from moving to adjacent reaction regions. This wall or physical barrier may be removed after the synthesis is carried out. One of skill in the art will appreciate that, at times, it may be beneficial to remove the wall or physical barrier before screening the array of materials.

In embodiments of the apparatus of the present invention, a small, precisely metered amount of each reactant component is delivered into each reaction region. This may be accomplished using a variety of delivery techniques, either alone or in combination with a variety of masking techniques. Such techniques include, but are not limited to, dip coating, doctor blade coating, spray coating, spin coating, webcoating, electrodeposition, vacuum deposition, sputtering, laser ablation and inkjet printing. In one particular embodiment, the various reactant components can be deposited into the reaction regions of interest from a dispenser in the form of droplets or powder, which can then be spread out to form the desired layer. Conventional micropipetting apparatus can, for example, be adapted to dispense droplet volumes of 5 nanoliters or smaller from a capillary. Such droplets can fit within a reaction region having a diameter of 300 µm or less when a mask is employed. The dispenser can also be of the type employed in conventional ink-jet printers. Such ink-jet dispenser systems include, for example, the pulse pressure type dispenser system, the bubble jet type dispenser system and the slit jet type dispenser system. These ink-jet dispenser systems are able to deliver droplet volumes as small as 5 picoliters. Moreover, such dispenser systems can be manual or, alternatively, they can be automated using, for example, robotics techniques.

The apparatus of the present invention includes a dispenser that can be aligned with respect to the appropriate reaction regions by a variety of conventional systems. Such systems, which are widely used in the microelectronic device fabrication and testing arts, can deliver droplets to individual reaction regions at rates of up to 5,000 drops per second. The translational (X-Y) accuracy of such systems is well within 1 µm. The position of the dispenser stage of such systems can be calibrated with respect to the position of the substrate by a variety of methods known in the art. For example, with only one or two reference points on the substrate surface, a "dead reckoning" method can be provided to locate each reaction region of the array. The reference marks in any such systems can be accurately identified by using capacitive, resistive or optical sensors. Alternatively, a "vision" system employing a camera or a memory system based on robotic arm movement can be employed.

In another embodiment of the present invention, the dispenser can be aligned with respect to the reaction region of interest by a system analogous to that employed in magnetic and optical storage media fields. For example, the reaction region in which the component is to be deposited is identified by its track and sector location on the disk. The dispenser is then moved to the appropriate track while the disk substrate rotates. When the appropriate reaction region is positioned below the dispenser, a droplet of reactant solution is released. Alternatively, the dispenser may be held fixed while the substrate moves back and forth.

III. ISOLATION OF DEVICE REGIONS ON A SUBSTRATE

In a preferred embodiment, the methods of the present invention are used to prepare an array of diverse materials at known locations on a single Substrate surface. Essentially, any conceivable Substrate can be employed in the invention. The Substrate can be organic, inorganic, biological, nonbiological, or a combination of any of these, existing as particles, strands, precipitates, gels, sheets, tubing, spheres, containers, capillaries, pads, slices, films, plates, slides, etc. The substrate can have any convenient shape, such a disc, square, sphere, circle, etc. The substrate is preferably flat, but may take on a variety of alternative surface configurations. For example, the substrate may contain raised or depressed regions on which the synthesis of diverse materials takes place. The substrate and its surface preferably form a rigid support on which to carry out the reaction described herein. The substrate may be any of a wide variety of materials including, for example, polymers, plastics, pyrex, quartz, resins, silicon, silica or silica-based materials, carbon, metals, inorganic glasses, inorganic crystals, membranes, etc. Other substrate materials will be readily apparent to those of skill in the art upon review of this disclosure. Surfaces on the solid substrate can be composed of the same materials as the substrate or, alternatively, they can be different, i.e., the substrates can be coated with a different material.

Moreover, the substrate surface can contain thereon an adsorbent (for example, cellulose) to which the components of interest are delivered. The most appropriate substrate and substrate-surface materials will depend on the class of materials to be synthesized and the selection in any given case will be readily apparent to those of skill in the art.

In some embodiments, a predefined region on the substrate and, therefore, the area upon which each optoelectronic device is formed is smaller than about 25 $cm^2$, preferably less than 10 $cm^2$, more preferably less than 5 $cm^2$, even more preferably 1 $cm^2$, still more preferably less than 1 $mm^2$, and still more preferably less than 0.5 $mm^2$. In most preferred embodiments, the regions have an area less than about 10,000 μm², preferably less than 1,000 μm², more preferably less than 100 μm², and even more preferably less than 10 μm².

In preferred embodiments, a single substrate has at least 10 different devices and, more preferably, at least 100 different devices synthesized thereon. In even more preferred embodiments, a single Substrate has more than $10^1$, $10^2$, $10^3$, $10^4$, $10^5$, $10^6$, or more optoelectronic devices synthesized thereon. In some embodiments, the delivery process is repeated to provide materials with as few as one or two components to a given layer, although the process may be readily adapted to form layers having 3, 4, 5, 6, 7, 8 or more components therein. The density of regions per unit area will be greater than 0.04 regions/cm², more preferably greater than 0.1 regions/cm², even more preferably greater than 1 region/cm², even more preferably greater than 10 regions/cm², and still more preferably greater than 100 regions/cm².

By way of example droplets of between about 0.5 microliters and about 1 microliter can spread in a circular area about 5 mm to 15 mm (e.g., about 10 mm) in diameter. These droplets can be placed at a density of 20 spots per glass slide, which may be a rectangle whose size is 6" by 4" (about 15 cm by 10 cm). This corresponds to a density of roughly 0.13 regions/cm².

As previously explained, the substrate is preferably flat, but may take on a variety of alternative surface configurations. Regardless of the configuration of the substrate surface, it is imperative that the reactant components in the individual reaction regions be prevented from moving to adjacent reaction regions. Most simply, this can be ensured by leaving a sufficient amount of space between the regions on the substrate so that the various components cannot interdiffuse between reaction regions. Moreover, this can be ensured by providing an appropriate barrier between the various reaction regions on the substrate. A mechanical device or physical structure can be used to define the various regions on the substrate. For example, a wall or other physical barrier can be used to prevent the reactant components in the individual reaction regions from moving to adjacent reaction regions. Alternatively, a dimple or other recess can be used to prevent the reactant components in the individual reaction regions from moving to adjacent reaction regions.

Even when a dimpled surface is employed, it is often important to ensure that the substrate material is not wetted beyond the reaction region parameters. Most simply, this can be ensured by leaving a sufficient amount of space between the regions on the substrate so that the various components cannot interdiffuse between reaction regions. In addition, other techniques can be applied to control the physical interactions that affect wetting, thereby ensuring that the solutions in the individual reaction regions do not wet the surrounding surface and contaminate other reaction regions. Whether or not a liquid droplet will wet a solid surface is governed by three tensions: the surface tension at the liquid-air interface, the interfacial tension at the solid-liquid interface and the surface tension at the solid-air interface. If the sum of the liquid-air and liquid-solid tensions is greater than the solid-air tension, the liquid drop will form a bead (a phenomenon known as "lensing"). If, on the other hand, the sum of the liquid-air and liquid-solid tensions is less than the solid-air tension, the drop will not be confined to a given location, but will instead spread over the surface. Even if the surface tensions are such that the drop will not spread over the surface, the contact or wetting angle (i.e., the angle between the edge of the drop and the solid substrate) may be sufficiently small that the drop will cover a relatively large area (possibly extending beyond the confines of a given reaction region). Further, small wetting angles can lead to formation of a thin (approximately 10 Å to 20 Å) "precursor film" which spreads away from the liquid bead. Larger wetting angles provide "taller" beads that take up less surface area on the substrate and do not form precursor films. Specifically, if the wetting angle is greater than about 90°, a precursor film will not form.

Methods for controlling chemical compositions and, in turn, the local surface free energy of a substrate surface include a variety of techniques apparent to those in the art. If, for example, an aqueous reactant solution is used, the region inside the reaction regions may be hydrophilic, while the region surrounding the reaction regions may be hydrophobic. As such, the surface chemistry can be varied from position to position on the substrate to control the surface free energy and, in turn, the contact angle of the drops of reactant solution. In this manner, an array of reaction regions can be defined on the substrate surface. One could also use an organic solvent in lieu of an aqueous reactant solution.

Moreover, as previously explained, the reactant components in the individual reaction regions can be prevented from moving to adjacent reaction regions by leaving a sufficient amount of space between the regions on the substrate so that the various components cannot interdiffuse between reaction regions.

IV. METHODS FOR DELIVERY OF LAYERS

A. Thin Film Deposition

In the delivery systems of the present invention, small, precisely metered amounts of each component of a given layer are delivered into selected portions of each device region. This may be accomplished using a variety of delivery techniques, either alone or in combination with a variety of physical masking or photolithographic techniques. Preferred delivery techniques that are suitable for use in embodiments of the methods of the present invention generally involve the use of a dispenser to deliver the components.

The various components can be deposited on the substrate using a number of different mechanical techniques in combination with physical masking techniques. Such mechanical techniques include, for example, spray coating, spin coating, dip coating, and draining, flow coating, roller coating, pressure-curtain coating, brushing, sublimation, condensation, chemical bath deposition, lamination, electrodeposition, electropolymerization, web coating, and the like.

Sprayers which can be used to deposit thin-films include, for example, ultrasonic nozzle sprayers, air atomizing nozzle sprayers and atomizing nozzle sprayers. In ultrasonic sprayers, disc-shaped ceramic piezoelectric transducers covert electrical energy into mechanical energy. The transducers receive electrical input in the form of a high-frequency signal from a power supply that acts as a combination oscillator/amplifier. In air atomizing sprayers, the nozzles intermix air and liquid streams to produce a completely atomized spray. In atomizing sprayers, the nozzles use the energy of from a pressurized liquid to atomize the liquid and, in turn, produce a spray. Successive rounds of deposition, through different physical masks, using mechanical techniques such as spraying generates an array of reactants on the substrate for parallel synthesis.

In spin coating techniques, the component or components are delivered to the device region in the form of a liquid. The substrate is then spun at high speed to spread out the liquid in a thin film over the surface of the substrate. If desired, individual device regions may be rotatably mounted to the substrate so that they may be individually spun independent of each other.

In doctor blade coating, a liquid droplet is deposited on the substrate and spread out into a thin film using a blade that moves across the surface of the substrate. The thickness of the film may be varied by adjusting the clearance between the blade and the surface of the substrate. In dip coating, the substrate is dipped into a liquid solution containing the layer components dissolved in a solvent. When the substrate is removed, the solvent dries leaving the layer material behind as a thin film on the substrate. The substrate may be divided into regions that may be dip coated independently of each other to facilitate variation of the layer properties from one device to the next.

Layers of certain materials, such as metals or ceramics, may be formed by electrodeposition. In this process, the components of the layer are in the form of ions dissolved in an electrolytic solution. A voltage, applied between the electrolytic solution and the device region causes the ions to deposit on the device region to form the layer. A fine-tipped probe may be used in an electroplating solution to locally electrodeposit material out of the solution to form microstructures.

In addition to the foregoing techniques, photolithographic techniques of the type known in the semiconductor industry can be used to pattern a given layer of the devices. For an overview of such techniques, see, for example, Sze, VLSI Technology, McGraw-Hill (1983) and Mead, et al., Introduction to VLSI Systems, Addison-Wesley (1980), which are incorporated herein by reference for all purposes. A number of different photolithographic techniques known to those of skill in the art can be used. In one embodiment, for example, a photoresist is deposited on the substrate surface; the photoresist is selectively exposed, i.e., photolyzed; the photolyzed or exposed photoresist is removed; a reactant is deposited on the exposed regions on the substrate; and the remaining unphotolyzed photoresist is removed. Alternatively, when a negative photoresist is used, the photoresist is deposited on the substrate surface; the photoresist is selectively exposed, i.e., photolyzed; the unphotolyzed photoresist is removed; a reactant is deposited on the exposed regions on the substrate; and the remaining photoresist is removed. In another embodiment, a reactant is deposited on the substrate using, for example, spin-on or spin-coating techniques; a photoresist is deposited on top of the reactant; the photoresist is selectively exposed, i.e., photolyzed; the photoresist is removed from the exposed regions; the exposed regions are etched to remove the reactant from those regions; and the remaining unphotolyzed photoresist is removed. As with the previous embodiment, a negative photoresist can be used in place of the positive photoresist. Such photolithographic techniques can be repeated to produce an array of reactants on the substrate for parallel synthesis.

Using the foregoing thin-film deposition techniques in combination with physical masking or photolithographic techniques, a reactant component can be delivered to all of the predefined regions on the substrate in a uniform distribution (i.e., in the stoichiometry at each predefined region) or, alternatively, in a gradient of stoichiometries, wherein the stoichiometry of the components for a given layer varies in a predetermined fashion from device to device, e.g., along a row or column in the array. Moreover, multiple reactant components can be delivered to all of the predefined regions on the substrate in a gradient of stoichiometries.

By way of example, two components (component A and component B) that are used to make a given layer of a device may be delivered to each device region on a substrate that has space for 100 device regions. The ratio A:B of the two components may be the same for each device. This is often desirable e.g., to provide statistics on the repeatability of the formation of the layer from device to device. Alternatively the ratio A:B may vary from device to device. Such variation may be in uniform increments from one device to the next and may cover the whole range of possible rations, e.g., from 0:1 for the first device to 1:0 for the $100^{th}$ device, or any smaller range of ratios that may be of interest.

It will be readily apparent to those of skill in the art that the foregoing deposition techniques are intended to illustrate, and not restrict, the ways in which the reactants can be deposited on the substrate in the form of thin-films. Other deposition techniques known to and used by those of skill in the art can also be used.

B. Layer Formation Using a Dispenser

In addition to the foregoing delivery techniques, dispensers can be utilized to generate diverse combinations of reactant components in the form of droplets or powder on a single substrate. As explained above, commercially available micropipetting apparatus can be adapted to dispense droplet volumes of 5 nanoliters or smaller from a capillary. Such droplets can fit within a reaction region having a diameter of 300 µm or less when a non-wetting mask is employed. In some embodiments, the micropipette can be accurately and precisely positioned above the reaction, as described below, before the reactant solution is deposited. In other embodiments, manual pipetters can dispense, e.g., volumes of between about 0.5 microliters and about 1 microliter.

In a different preferred embodiment, the present invention employs a solution depositing apparatus that resembles devices commonly employed in the ink-jet printing field. Such ink-jet dispensers include, for example, the pulse pressure type, the bubble jet type and the slit jet type. In an ink-jet dispenser of the pulse pressure type, the printing ink is jetted from a nozzle according to a change in pressure applied by a piezoelectric device. In an ink-jet dispenser of the bubble jet type, bubbles are generated with heat generated with a resistance device embedded in a nozzle, and printing ink is jetted by using the force due to the expansion of a bubble. In an ink-jet dispenser of the slit jet type, printing ink is filled within a slit-like orifice wherein recording electrodes are aligned in correspondence to pixels, and a DC voltage pulse is applied between a recording electrode and a counter electrode arranged behind a recording paper. In this system, the printing ink around the top of the record electrode is charged electrically so that the ink is ejected towards the recording paper with an electrostatic force to record a dot on the paper. Such ink-jet printers can be used with minor modification by simply substituting a reactant containing solution or reactant containing powder for the ink. For example, Wong, et al., European Patent Application 260 965, incorporated herein by reference for all purposes, describes the use of a pulse pressure type ink-jet printer to apply an antibody to a solid matrix. In the process, a solution containing the antibody is forced through a small bore nozzle that is vibrating in a manner that fragments the solution into discrete droplets. The droplets are subsequently charged by passing through an electric field and then deflected onto the matrix material.

For illustrative purposes, a conventional ink drop printer of the pulse pressure type includes a reservoir in which ink is held under pressure. The ink reservoir feeds a pipe which is connected to a nozzle. An electromechanical transducer is employed to vibrate the nozzle at some suitable high frequency. The actual structure of the nozzle may have a number of different constructions, including a drawn glass tube which is vibrated by an external transducer, or a metal tube vibrated by an external transducer (e.g., a piezoelectric crystal), or a magnetostrictive metal tube which is magnetostrictively vibrated. The ink accordingly is ejected from the nozzle in a stream which shortly thereafter breaks into individual drops. An electrode may be present near the nozzle to impart a charge to the droplets.

Figure 2:
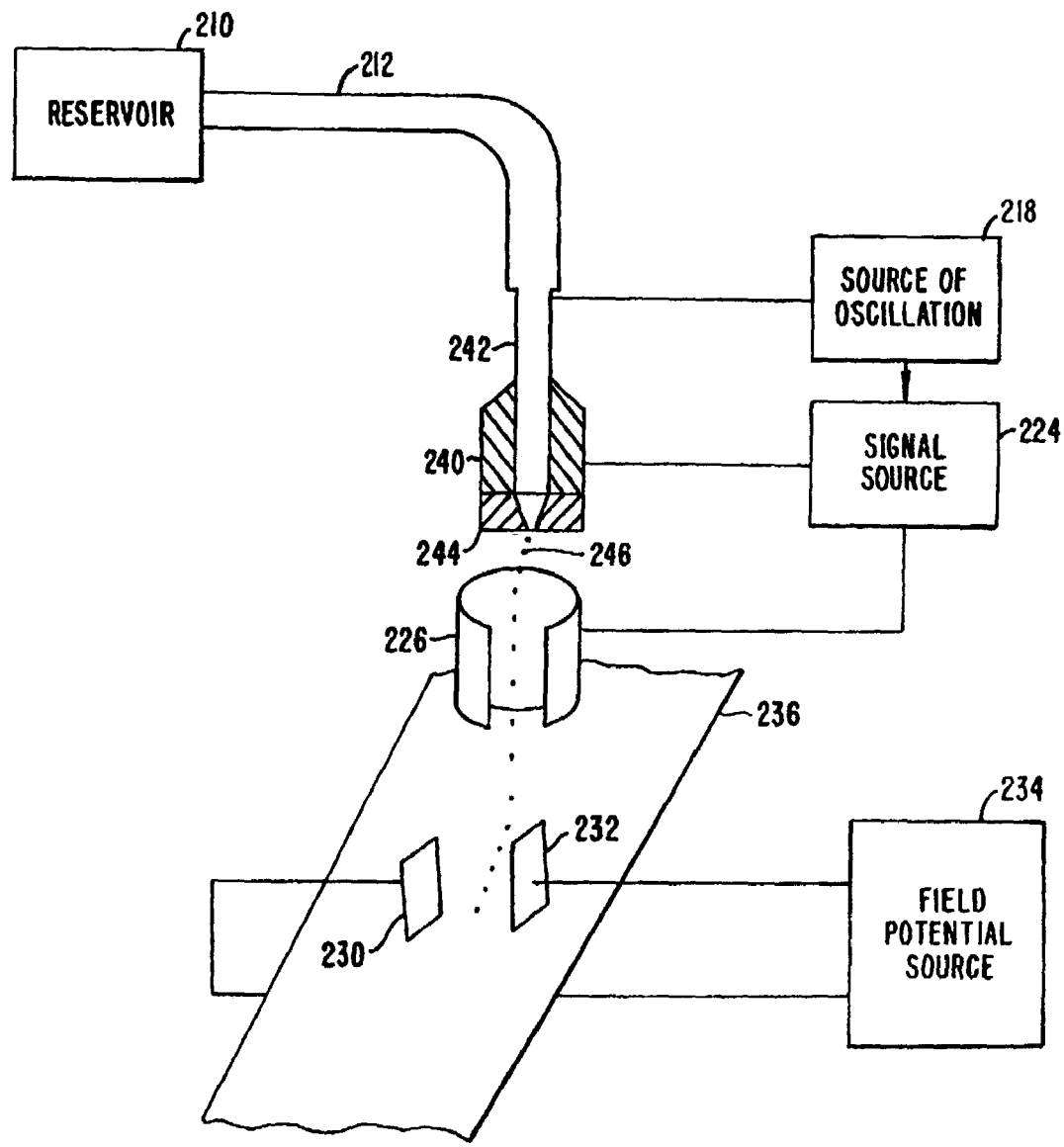
FIG. 2 depicts a schematic diagram of a guided droplet dispenser that may be used in accordance with embodiments of the present invention.

A schematic drawing of an ink drop dispenser of the pulse pressure type such as is described in U.S. Pat. No. 5,985,356, which may be employed in the present invention is shown in FIG. 2. This apparatus comprises a reservoir 210 which contains a solution under pressure. Tubing 212 is connected to the reservoir 210 and terminates in a metal nozzle 242. Although a single reservoir 210 is shown in FIG. 2, it is also possible to implement deposition a combination of solutions though the use of multiple reservoirs in communication with the Nozzle 242, e.g., with an appropriate set of valves to control the mixing ratio of the components of the solution ultimately dispensed through Nozzle 242.

Nozzle 242 is disposed within a hole provided in piezoelectric crystal 240. The end of the metal tube and the end of the piezoelectric crystal are made to coincide. The tubing and the piezoelectric crystal are soldered together to form a permanent waterproof attachment. The coincident ends of the crystal and the tubing are covered with a washer 244 which is termed an orifice washer. The washer 244 has an opening 246 drilled therethrough through which the solution is emitted under pressure. A source of oscillations 218 is connected between the outside of the metal tubing 242 and the outside of the piezoelectric crystal 240. The construction is such that hermetic sealing can be employed which protects against electrochemical and atmospheric attack of the components.

The piezoelectric crystal 240 is vibrated substantially at the frequency of the source of oscillations causing the tubing and nozzle to vibrate whereby the solution stream breaks down into droplets 246. A signal source 224 which is synchronized by the source of oscillations is connected between the nozzle and the charging cylinder 226. As a result, each of the drops, which should be substantially the same mass, receives a charge, the amplitude of which is determined by the amplitude of the signal applied from the source 224 and the charging cylinder 226.

The charged drops, after passing through the charging cylinder, pass into an electric field which is established between two plates respectively 230 and 232 which are connected to a field potential source 234. As a result of the action between the field and the charge of each drop, the drops are deflected from their center line path between the plates in accordance with the charge which they carry. Thus, when they fall on an optionally moving writing medium 236, a deposition pattern occurs on the writing medium representative of the information in the signals.

Although the ink-jet printer of the pulse pressure type has been described in greater detail herein for purposes of illustration, it will be readily apparent to those of skill in the art that ink-jet printers of the bubble jet type and the slit jet type can also be used, with only minor modifications, to deliver reactant components to predefined regions on the substrate. Moreover, although the foregoing discussion refers to a single nozzle, it will be readily apparent to those of skill in the art that ink-jet printers having multiple nozzles can be used to deliver multiple reactant components to a single predefined region on the substrate or, alternatively, to multiple predefined regions on the substrate. In addition, as improvements are made in field of ink-jet printers, improvements such as, e.g., laser assisted inkjet printing can be used in the methods of the present invention.

In other embodiments, the reactant solutions can be delivered from a reservoir to the substrate by an electrophoretic pump. In such a device, a thin capillary connects a reservoir of the reactant with the nozzle of the dispenser. At both ends of the capillary, electrodes are present to provide a potential difference. As is known in the art, the speed at which a chemical species travels in a potential gradient of an electrophoretic medium is governed by a variety of physical properties, including the charge density, size, and shape of the species being transported, as well as the physical and chemical properties of the transport medium itself. Under the proper conditions of potential gradient, capillary dimensions, and transport medium rheology, a hydrodynamic flow will be set up within the capillary. Thus, bulk fluid containing the reactant of interest can be pumped from a reservoir to the substrate. By adjusting the appropriate position of the substrate with respect to the electrophoretic pump nozzle, the reactant solution can be precisely delivered to predefined reaction regions.

Using the aforementioned dispenser systems, the reactants can be delivered to predefined regions on the substrate either sequentially or simultaneously. In a presently preferred embodiment, the components of a layer are simultaneously delivered to either a single predefined device region on the substrate or, alternatively, to multiple predefined device regions on the substrate. For example, using an ink-jet dispenser having two nozzles, two different reactants can be simultaneously delivered to a single predefined region on the substrate. Alternatively, using this same ink-jet dispenser, a reactant can be simultaneously delivered to two different predefined regions on the substrate. In this instance, the same reactant or, alternatively, two different reactants can be delivered. If the same reactant is delivered to both of the predefined regions, it can be delivered at either the same or different concentrations. Similarly, using an ink-jet dispenser having eight nozzles, for example, eight different reactants can be simultaneously delivered to a single predefined region on the substrate or, alternatively, eight reactants (either the same or different) can be simultaneously delivered to eight different predefined regions on the substrate.

V. MOVING THE DISPENSER WITH RESPECT TO THE SUBSTRATE

To deposit device layers consistently at precisely specified regions using a dispenser, a frame of reference common to the delivery instrument and the substrate is required. In other words, the reference coordinates of the instrument must be accurately mapped onto the reference coordinates of the substrate. Ideally, only two reference points on the substrate would be required to completely map the array of device regions. The dispenser instrument may locate these reference points and then adjust its internal reference coordinates to provide the necessary mapping. After this, the dispenser can move a particular distance in a particular direction and be positioned directly over a known region. Of course, the dispenser instrument must provide precisely repeatable movements. Further, the individual device regions of the array must not move with respect to the reference marks on the substrate after the reference marks have been formed. Unfortunately, pressing or other mechanical operations commonly encountered during fabrication and use of a substrate can warp the substrate such that the correspondence between the reference marks and the reaction regions is altered. To allow for this possibility, a substrate containing both "global" and "local" reference marks is employed. In preferred embodiments, only two global reference marks are conveniently located on the substrate to define the initial frame of reference. When these points are located, the dispenser instrument has an approximate map of the substrate and the predefined regions therein. To assist in locating the exact position of the regions, the substrate is further subdivided into local frames of reference. Thus, in an initial, "course" adjustment, the dispenser is positioned within one of the local frames of reference. Once in the local region, the dispensing instrument looks for local reference marks to define further a local frame of reference. From these, the dispenser moves exactly to the reaction region where the reactant is deposited. In this manner, the effects of warpage or other deformation can be minimized. The number of local reference marks is determined by the amount of deformation expected in the substrate. If the substrate is sufficiently rigid so that little or no deformation will occur, very few local reference marks are required. If substantial deformation is expected, however, more local reference marks are required.

Starting at a single reference point, the micropipette or other dispenser may translate from one device region to other device regions of the substrate by a correct distance in the correct direction (this is the "dead reckoning" navigational technique). Alternatively, the substrate may translate while the dispenser is kept fixed. In addition, some combination of dispenser motion and substrate motion may be employed. Thus, the dispenser can move from device region to device region, or to different points within a given device region, dispensing correctly metered amounts of reactant. A vision or blind system can be employed in order to initially locate a reference point and align the dispenser directly over it.

In a vision system, a camera is rigidly mounted to the dispenser nozzle. When the camera locates the reference point(s), the dispenser is known to be a fixed distance and direction away from the point, and a frame of reference is established. Blind systems may locate the reference point(s), e.g., by capacitive, resistive, or optical techniques. In one example of an optical technique, a laser beam is transmitted through or reflected from the substrate. When the beam encounters a reference mark, a sensor detects change in light intensity of the laser beam. Capacitive and resistive techniques may be similarly applied. A sensor registers a change in capacitance or resistivity when a reference point is encountered.

For purposes of this invention, the spacing between the individual regions will vary in accordance with the size of the regions used. For example, if a 1 mm$^2$ region is used, the spacing between the individual regions will preferably be on the order of 1 mm or less. If, for example, a 10 μm$^2$ region is used, the spacing between the individual regions will preferably be on the order of 10 μm or less. By way of example, a spot produced using manually operated multichannel pipettors can be about 10 mm in diameter corresponding to an area of about 75-100 mm2. The spacing between such spots can be about 5-10 mm. This would give between about 1 and about 1.5 regions/cm$^2$ Further, the angular relation between the cells is preferably consistent, to within 0.1°. Of course, the photolithographic or other process used to define the arrangement of cells will accurately define the angle and spacing. However, in subsequent processes (e.g., pressing processes), the angle can be distorted. Thus, in some embodiments, it may be necessary to employ "local" reference points throughout the array.

Translational mechanisms capable of moving with the desired precision are preferably equipped with position feedback mechanisms (i.e., encoders) of the type used in devices for semiconductor device manufacturing and testing. Such mechanisms will preferably be closed loop systems with insignificant backlash and hysteresis. In preferred embodiments, the translation mechanism will have a high resolution, i.e., greater than five motor ticks per encoder count. Further, the electromechanical mechanism will preferably have a high repeatability relative to the region diameter travel distance (preferably, ±1-5 μm).

To deposit a drop of reactant solution on the substrate accurately, the dispenser nozzle must be placed a correct distance above the surface. The dispenser tip preferably will be located about 0.1 cm to about 3 cm above the substrate surface when the drop is released. The degree of control necessary to achieve such accuracy can be attained with a repeatable high-resolution translation mechanism of the type described above. In one embodiment, the height above the substrate is determined by moving the dispenser toward the substrate in small increments, until the dispenser tip touches the substrate. At this point, the dispenser is moved away from the surface a fixed number of increments which corresponds to a specific distance. From there, the drop is released to the cell below. Preferably, the increments in which the dispenser moves will vary in accordance with the size of the regions used.

In an alternative embodiment, the dispenser nozzle may be encircled by a sheath that rigidly extends a fixed distance beyond the dispenser tip. Preferably, this distance corresponds to the distance at which one or more drops of the solution will fall when delivered to the selected device region. Thus, when the sheath contacts the substrate surface, the movement of the dispenser is halted and the drop is released. It is not necessary in this embodiment to move the dispenser back, away from the substrate, after contact is made. In this embodiment, as well as the previous embodiment, the point of contact with the surface can be determined by a variety of techniques such as by monitoring the capacitance or resistance between the tip of the dispenser (or sheath) and the substrate below. A rapid change in either of these properties is observed upon contact with the surface.

To this point, the dispenser delivery system has been described only in terms of translational movements. However, other systems may also be employed. In one embodiment, the dispenser is aligned with respect to the region of interest by a system analogous to that employed in magnetic and optical storage media fields. For example, the device region onto which a layer is to be deposited is identified by a track and sector location on the disk. The dispenser is then moved to the appropriate track while the disk substrate rotates. When the appropriate cell is positioned below the dispenser (as referenced by the appropriate sector on the track), a droplet of layer-forming solution may be released.

Control of the droplet size may be accomplished by various techniques. For example, in one embodiment, a conventional micropipetting instrument is adapted to dispense droplets of five nanoliters or smaller from a capillary. Such droplets may fit within regions having diameters of 300 μm or less when a non-wetting mask is employed.

Although the above embodiments have been directed to systems employing liquid droplets, minuscule aliquots of each test substance can also be delivered to the reaction region as powders or miniature pellets. Pellets can be formed, for example, from the compound of interest and one or more kinds of inert binding material. The composition of such binders and methods for the preparation of the "pellets" will be apparent to those of skill in the art. Such "minipellets" will be compatible with a wide variety of test substances, stable for long periods of time and suitable for easy withdrawal from the storage vessel and dispensing.

VI. REACTING THE LAYER-FORMING COMPONENTS

Once the array of layer-forming components have been delivered to predefined device regions on the substrate, they may be reacted using a number of different synthetic routes. The components can be reacted using, for example, solution based synthesis techniques, photochemical techniques, polymerization techniques, template directed synthesis techniques, epitaxial growth techniques, by the sol-gel process, by thermal, infrared or microwave heating, by calcination, sintering or annealing, by hydrothermal methods, by flux methods, by crystallization through vaporization of solvent, by electrodeposition, chemical bath deposition, electropolymerization, web coating, inkjet printing, etc. Other useful synthesis techniques will be apparent to those of skill in the art upon review of this disclosure. Moreover, the most appropriate synthetic route will depend on the class of materials to be synthesized, and the selection in any given case will be readily apparent to those of skill in the art. In addition, it will be readily apparent to those of skill in the art that, if necessary, the reactant components can be mixed using, for example, ultrasonic techniques, mechanical techniques, etc. Such techniques can be applied directly to a given predefined region on the substrate or, alternatively, to all of the predefined regions on the substrate in a simultaneous fashion (e.g., the substrate can be mechanically moved in a manner such that the components are effectively mixed).

Reaction rates can be increased at lower temperatures by depositing the layer-forming materials on the substrate in the form of very thin-films or, alternatively, by using solution based synthesis techniques wherein the reactants are delivered to the substrate in the form of a solution. Moreover, the array of reactant components can be pressurized or depressurized under an inert atmosphere, oxygen or other gas. In addition, the various device regions on the substrate can be exposed to different heat histories using, for example, laser thermolysis, wherein bursts of energy of a predetermined duration and intensity are delivered to target regions on the substrate.

Furthermore, the array of devices can be processed between the various delivery steps. For example, one or more initial components for forming a layer can be delivered to a given device region on a substrate and, thereafter, exposed to oxygen at elevated temperature, for example. Subsequently, an additional component or components can be delivered to the given device region and, thereafter reacted with the initial components under a set of reaction conditions to form the layer. Other manipulations and processing steps which can be carried out between the various delivery steps will be apparent to those of skill in the art upon reading this disclosure. For example, the substrate could be soaked in a bath for chemical bath deposition in a given amount of time. Alternatively, one or more layers may be electrodeposited or electropolymerized onto the substrate at a specific voltage, current, deposition time, electrochemical bath, etc As such, using the methods of the present invention, the following materials can be prepared: covalent network solids, ionic solids and molecular solids. More particularly, the methods of the present invention can be used to prepare device having layers made from, e.g., inorganic materials, intermetallic materials, metal alloys, ceramic materials, organic materials, organometallic materials, non-biological organic polymers, composite materials (e.g., inorganic composites, organic composites, or combinations thereof), etc.

VII. SCREENING THE ARRAY OF DEVICES

Once prepared, the array of devices can be screened in parallel or in serial for devices having useful operating parameters. Either the entire array or, alternatively, a section thereof (e.g., a row, column or other subset of predefined regions) may be screened in parallel for materials having useful properties.

Preferably, the combined synthesis and scanning detection system should be capable of fabricating and testing from 200 to 20,000 individual device samples per month or more. Generally, a greater density of devices per unit area on a substrate allows for a greater number of devices that can be scanned per unit time. Optimally, the scanning apparatus will desirably have a scanning resolution (number of devices per unit area that may be scanned) at least as great as the density of devices fabricated on the substrate. Scanning detection systems are preferably utilized to screen an array of devices wherein the density of device regions per unit area will be greater than 0.04 regions/cm$^2$, more preferably greater than 0.1 regions/cm$^2$, even more preferably greater than 1 region/cm$^2$, even more preferably greater than 10 regions/cm$^2$. In most preferred embodiments, scanning detection systems are preferably utilized to screen an array of materials wherein the density of sampled regions per unit device area will be greater than 1,000 regions/cm$^2$, more preferably 10,000 regions/cm$^2$, even more preferably greater than 100,000 device regions/cm$^2$, and still more preferably 10,000,000 regions/cm$^2$.

Accordingly, in a preferred embodiment, the array of devices may be synthesized on a single substrate. By synthesizing the array of devices on a single substrate, the array may be more easily screened for devices having useful operating parameters. Devices found to possess desirable operating parameters can subsequently be prepared on a large-scale. Testing systems according to embodiments of the present invention may screen devices for a variety of operating parameters including, for example, electrical, thermal mechanical, morphological, optical, magnetic, chemical, etc. The variety of operating parameters is as vast as the variety of devices that may be fabricated. TABLE I lists some particularly, useful operating parameters associated with particular devices. Testing systems according to the present invention may screen such devices for such operating parameters among others.

TABLE I

| DEVICE | OPERATING PARAMETER |
|---|---|
| Electronic Devices | |
| Diode | V-I characteristics, reverse bias current, Environmental Resistance |

TABLE I-continued

| DEVICE | OPERATING PARAMETER |
|---|---|
| Transistor | V-I characteristics, Amplification, Frequency Response, Reverse bias current, Environmental Resistance |
| Resistor | Resistance, I-V characteristics, failure parameter, Environmental Resistance s |
| Capacitor | Capacitance, Breakdown Voltage, Q-V curve, Leakage resistance, Environmental Resistance |
| Optoelectronic Devices | |
| Photovoltaic devices, e.g., Solar Cells | Photovoltaic Efficiency, Environmental Resistance |
| Light Emitting Diodes | Color, V-I characteristics, EO conversion efficiency, Environmental Resistance |
| Tunable Lasers | Spectral Distribution, V-I characteristics |
| Optical Filters | Spectral Distribution, Environmental Resistance, Environmental Resistance |
| Spatial Devices | |
| Filters | Size/chemistry of particles filtered |
| Chemical Delivery Agents | Delivery rate |
| Drug Delivery Agents | Delivery rate |
| Storage Devices, e.g. fuel cells | Amount of fuel held per cell, stability, ease of release |
| Catalysts | Rate of chemical reaction Concentration of catalyst before, during and after reaction |

Figure 1B:
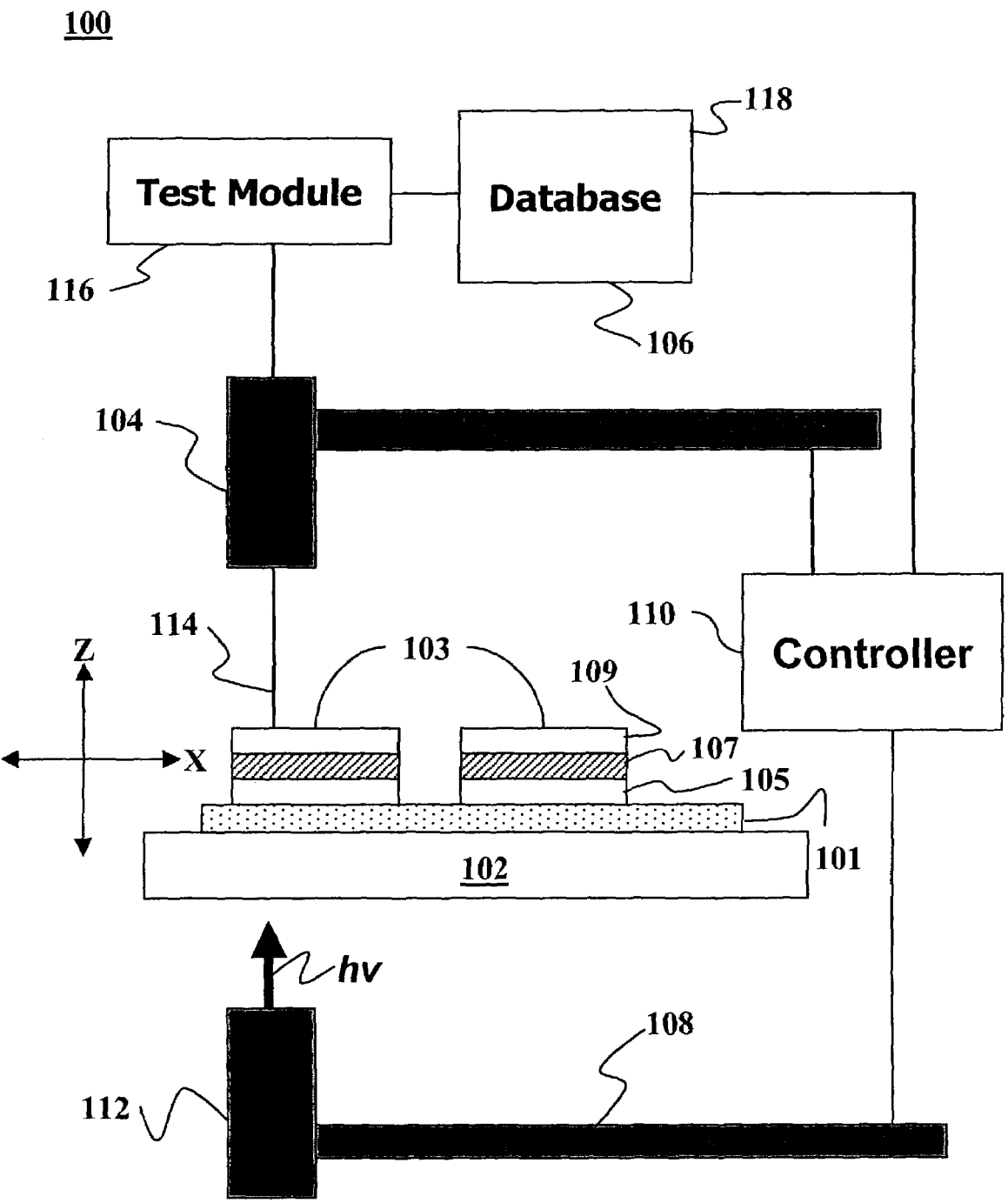

More particularly, to screen arrays of devices, an apparatus of the type shown in FIG. 1A-1B may be used. The apparatus 100 generally comprises a stage 102, a probe 104 mounted on a probe arm 106 and a controller 110. The apparatus may be regarded as a variation on a computer driven X-Y plotter. The stage 102 supports one or more substrates 101, having fabricated thereon one or more devices 103. The substrate may be made from any suitable material compatible with the devices 103. Such materials include, but are not limited to polymers, ceramics, glasses, metals and composite materials.

The probe arm 106 holds the probe in position in relation to the substrate(s) 101. Relative motion may be imparted between the probe 104 and the substrate(s) 101 in a controlled fashion. For example, the stage 102 may move the substrate(s) 101 in an X-Y plane relative to some fixed reference point while the probe remains in a fixed position relative to the fixed reference point. Alternatively, the stage 102 may remain fixed with respect to the reference point while probe arm 106 may be robotically controlled to impart an X-Y motion to the probe 104 relative to the fixed reference point. In such a case, the probe 104 may move relative to a fixed probe arm 106 or the probe 104 may be fixed to a moving probe arm 106 or there may be some combination of probe motion relative to the probe arm and probe arm motion relative to the stage. Furthermore, those having skill in the art will be able to devise some combination of stage motion and probe motion, e.g., where the stage moves in the X and the probe in Y or vice versa, analogous to the operation of an inkjet printer. In some applications it may also be desirable to impart a Z motion to the probe or stage, e.g., to bring the probe into contact or remove the probe from contact with one or more sample devices 103. Such a motion may be regarded as being analogous to the motion carried out by an X-Y plotter in raising or lowering the pen.

Although the stage 102 is shown as having a substantially flat surface other stage configurations are possible. For example, the stage 102 may include one or more rollers that hold a rigid or semi-rigid substrate 101 in a manner analogous to that in which an inkjet printer holds a piece of paper during printing. Alternatively, the stage 102 may be in the form of a drum that holds a substrate in a manner somewhat analogous to a roll of paper. Although FIG. 1A depicts that the stage 102 that supports the substrate 101 from below, (with respect to gravity) the invention is in no way limited to such a configuration. The stage may alternatively support the substrate from above or the side or at some angle, e.g., though the use of a clamp or chuck such as an electrostatic chuck. Furthermore, it is possible for the stage 102 to grip the substrate 101 by one or more edges to facilitate testing on both sides of the substrate.

By way of example, each device 103 may include two or more layers 105, 107, 109. The probe may be designed to characterize a response of the devices 103 to some external stimulus such as an applied voltage or externally applied radiation. For example, radiation hv may be supplied by a radiation source 112, which may be mounted to a source arm 108. Alternatively, the radiation source 112 may be mounted to the probe 104, the probe arm 106 or the stage 102. Motion of the source arm 108 and the probe arm 106 may be coordinated through the controller 110 so that the apparatus 100 may test the particular device 103 receiving radiation hv from the radiation source 112. The exact configuration of the radiation source 112 depends in part on whether the stage 102 moves or is fixed. In the case of an electrical measurement or an applied voltage, the probe 104 may include one or more contacts 114 that make electrical contact with one or more of the layers of a given device 103. The contacts 114 may be needle shaped to pierce one or more protective layers to make contact with the active layer of interest within the device 103. Alternatively, the device 103 may be configured with one or more openings in such protective layers that allow the probe direct access to the active layer of interest within the device 103.

The contacts 114 may be electrically connected to a test module 116 having e.g., a measuring device, a voltage source or both depending on the nature of the test. The test module may be coupled to the controller 110 such that the controller 110 may receive data from and send signals to the test module 116. The controller 110 may be in the form of a general-purpose computer programmed via appropriate software to act as a special purpose computer. Such software may be written using any suitable programming language or a special programming tool such as LabVIEW®. LabVIEW® is a registered trademark of National Instruments Corporation of Austin, Tex. The test module may also be configured to provide data directly to a database 118. Once the contacts 114 touch the active layer of interest, the test module 116 may be used to test the device 103. For example, if the devices 103 are solar cell devices, at least one of the probe contacts 114 is electrically coupled to a meter for measuring current and/or voltage. The radiation source 112, e.g., a laser diode, LED or lamp may supply radiation to one of the devices 103. The device produces an electrical current I and/or voltage V in response to the radiation hv from the source 112. The test module 116 may measures the current and voltage so that an electrical output power $P_{eo}$ from the device may be determined by calculating the product I×V. If a known optical power $P_{oi}$ from the source 112 impinges on the device 103 the controller 110 may calculate the solar cell efficiency as $P_{eo}/P_{oi}$. Such an efficiency may be a polychromatic efficiency, if the source 112 is a polychromatic source such as a lamp. Alternatively, the efficiency may be a monochromatic efficiency if the source 112 is a monochromatic source, such as a laser.

Information about the fabrication parameters of each device 103 and solar cell efficiency may be stored in the database 118. The radiation source 112 and probe 104 are shown in FIGS. 1A-1B as being situated on opposite sides of the substrate 101 with the substrate 101 between the source 112 and the devices 103. In this configuration it may be desirable to make the substrate from a material that is transparent to at least a portion of the radiation from the source 112. Alternatively, the apparatus 100 may be configured with the probe 104 and the radiation source 112 situated on the same side of the substrate 101 facing the devices 103.

The apparatus 100 can screen device arrays sequentially or, alternatively, in parallel using a scanning system. In a presently preferred embodiment, an X-Y scanning detection system is employed. In another embodiment, the detector may be fixed and the substrate having an array of devices thereon may be driven with a R-θ motion. In this embodiment, the substrate may be placed on a rotating stage (e.g., a spur gear) driven by a gear rack that is coupled to a micrometer and a stepping motor. Such a system desirably is capable of scanning an area having a radius approximately equal to a characteristic radius of the substrate with a 1 μm spatial resolution. The scanning and probing may be controlled through the use of a computer. Furthermore, it is also possible to move the substrate 101 while the probe 104 is kept fixed.

Although for simplicity, the probe 104 is shown as being configured to test one device 103 at a time, it is within the scope of the present invention to use a probe, or a plurality of probes, configured to simultaneously test two or more devices 103 on the substrate 101, or all devices situated on one or more substrates. In one such configuration, among others, two or more probes may be arranged side by side in a linear array to scan two or more devices at a time. The linear array of probes may be configured with each probe in the array aligned with a different column of devices (say in the Y-direction) in the array of devices 103 while the probe arm scans the probe array along the rows of devices (say in the X-direction). If the number of probes in the array is equal to or greater than the number of columns of devices 103 in the device array, the apparatus 100 may simultaneously collect data from all the devices in one column. Furthermore, such an apparatus may scan all of the devices in the device array in a single pass with the probe array. Such an apparatus may be configured with a linear array of radiation sources aligned with each radiation source in the array aligned with a corresponding one of the probes.

After testing data are taken, the data may be analyzed by a computer to obtain a correlation between the operational parameters of the devices and one or more result effective parameters of a given device. If desired, analytical results can be fed back to the delivery system so that the system can focus on the most promising combination of parameters in the next synthesis cycle.

It will be readily apparent to those of skill in the art that the foregoing detection systems are intended to illustrate, and not restrict, the ways in which the array of material can be screened for those materials having useful properties. Other detection systems known to and used by those of skill in the art can similarly be used.

VIII. ALTERNATIVE EMBODIMENTS

Figure 3A:
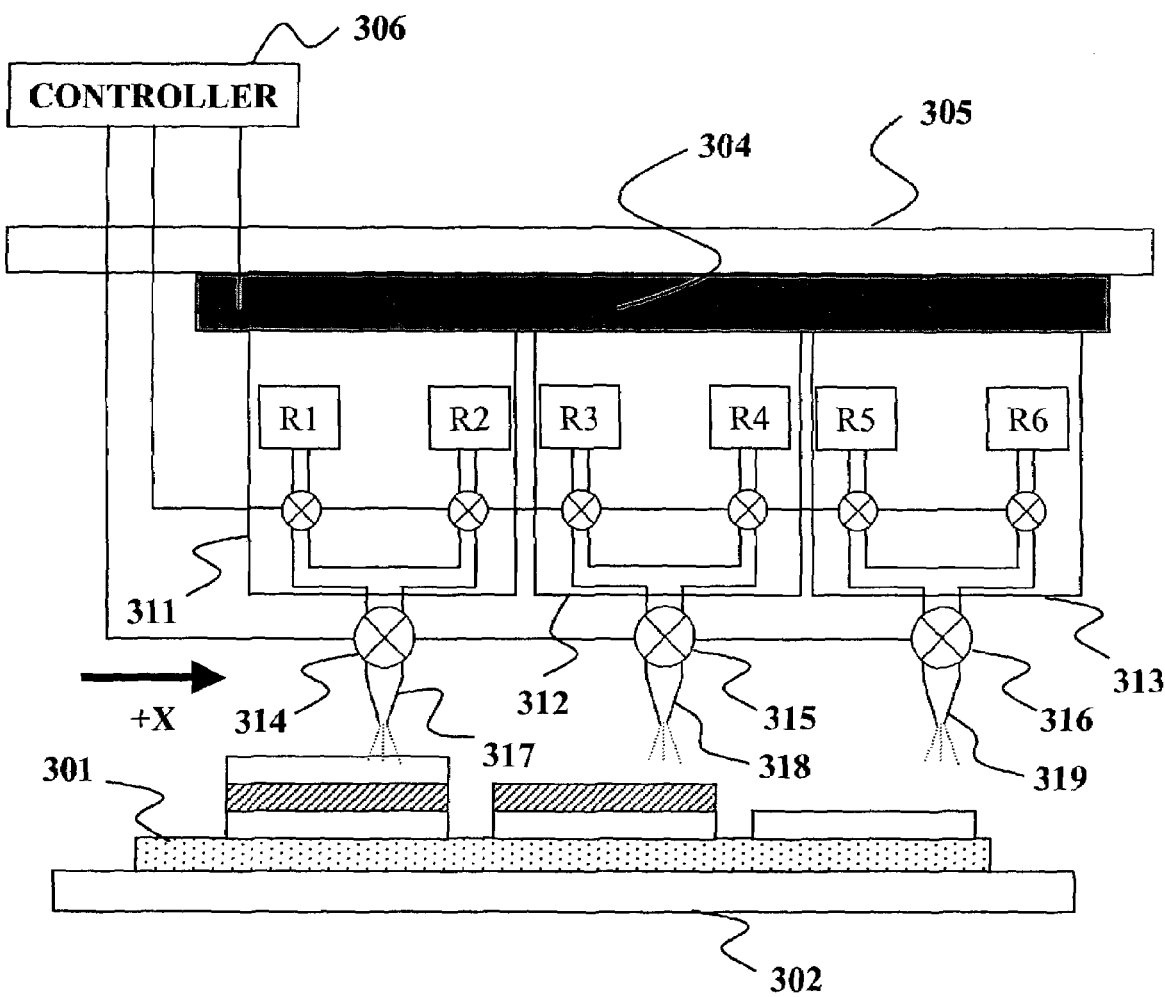
FIGS. 3A-3C show schematic diagrams of examples of apparatus for fabrication and testing of devices in accordance with embodiments of the present invention.
Figure 3B:
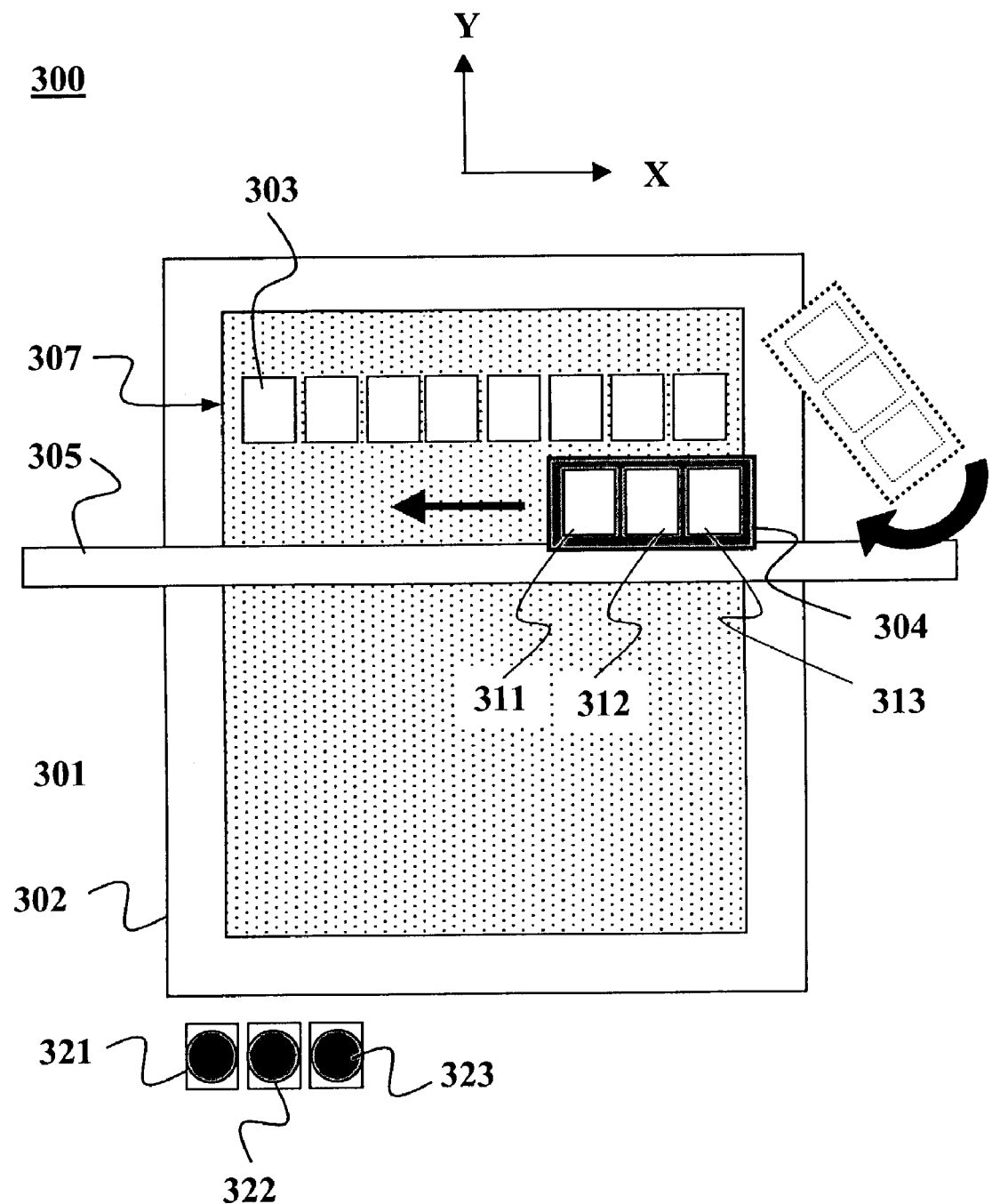

An example of a device fabrication and testing apparatus is depicted in FIGS. 3A-3B. The apparatus 300 generally includes a stage 302, a dispenser/testing head 304, and a controller 306. The stage 302 serves as a support for one or more substrates 301, each substrate containing an array of device regions as described above. The stage 302 may have features in common with the stage 102 described above. The dispenser/testing head may be mounted on a control arm 305 to facilitate motion of the dispenser/testing head relative to the stage 302.

The dispenser/testing head 304 may be adapted to receive one or more dispenser units 311, 312, 313. Each dispenser unit may dispense a layer-forming material having one or more components delivered from separate reservoirs R1, R2, R3, R4, R5, R6 and mixed before the resulting layer-forming material is dispensed onto the substrate to form a layer of a device. The reservoirs R1, R2, R3, R4, R5, R6 may be part of the dispenser units or they may be located remotely. Instructions from the controller 306 may control the delivery rates of the components. Dispenser valves 314, 315, 316 may open and close to permit or prevent the flow of layer-forming material from the dispenser units 311, 312, 313 through dispenser outlets 317, 317, 319. Flow valves connected between each reservoir and the dispenser valves may control the ration of the components in the mixture delivered by the dispensers to the substrate 301. The dispenser units 311, 312, 313 may be in the form of replaceable cartridges analogous to inkjet cartridges.

The dispenser units may sequentially deposit the layers that form an individual device in a serial-type fashion referred to herein as an "assembly-line" fashion. Referring to FIG. 3B, as the dispenser/testing head 304 moves relative to the stage in the positive X-direction as shown, the dispenser valves 314, 315, 316 open and close in sequence to allow sequential deposition of three different layers-forming materials. The first dispenser 311 dispenses a first layer-forming material to deposit a first layer of one or more devices on the substrate. The second dispenser 312 dispenses a second layer forming material on top of the first layer to form a second layer. The third dispenser 313 dispenses a third layer forming material on top of the second layer to form a third layer. By opening and closing the valves in an appropriate sequence as the dispenser testing head 304 moves across the stage 302 a whole row of three-layer devices may be fabricated in one pass.

Referring to FIG. 3A, when the dispenser/testing head reaches the end of a row the control arm 305 may move in the Y direction by an incremental distance. The dispenser testing head may rotate 180° and being depositing another row moving in the negative X direction. The process may be repeated until an entire array of devices has been fabricated.

Figure 3C:
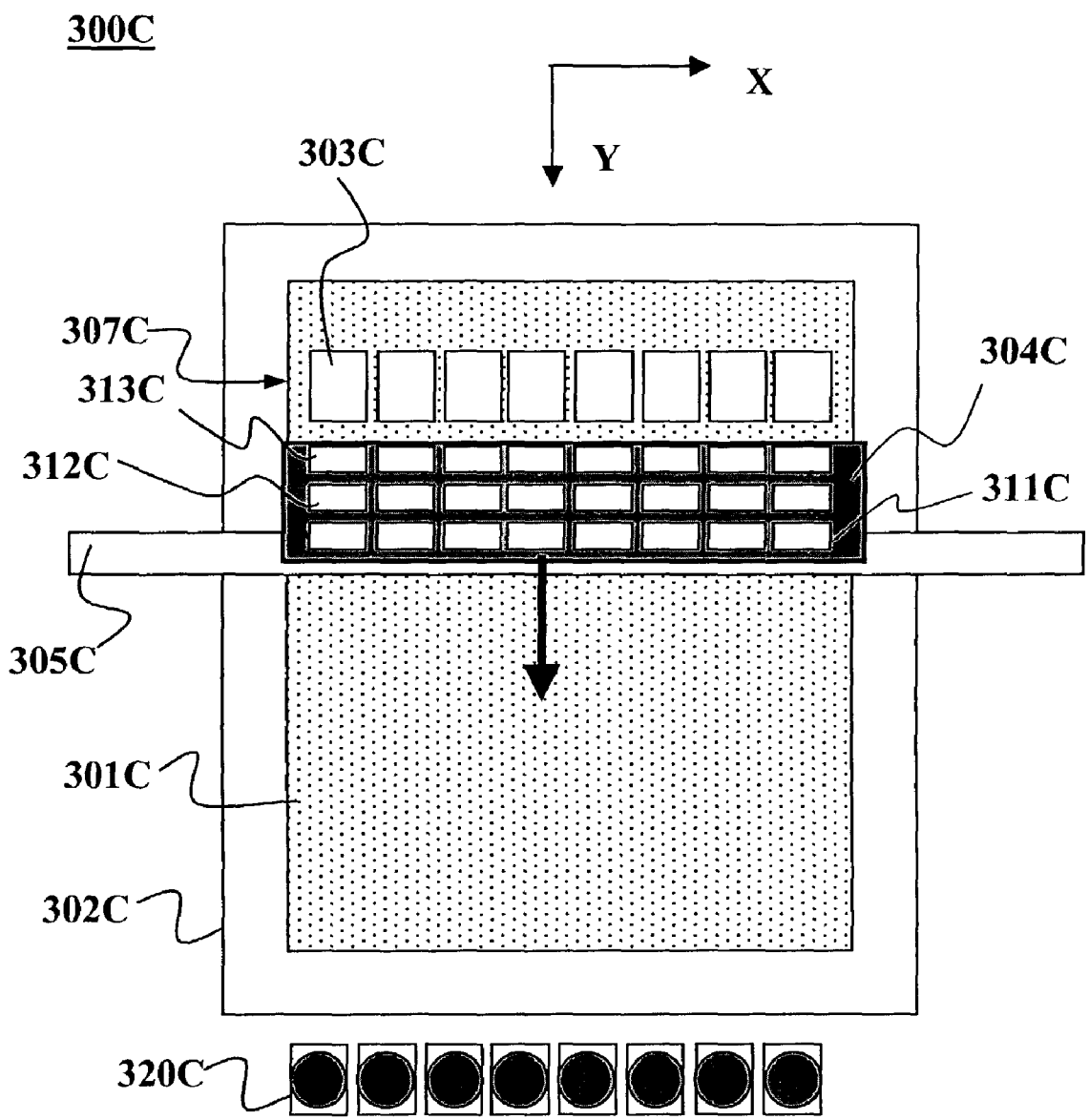

Although for simplicity, the dispenser/testing head 304 is shown as being configured to fabricate one device at a time, it is within the scope of the present invention to use a probe, or a plurality of probes, configured to simultaneously fabricate two or more devices on the substrate 301, or all devices situated on one or more substrates. In one such configuration, among others, shown in FIG. 3C, two or more linear arrays 311C, 312C, 313C of dispenser units may be arranged in a dispenser/probe head 304C to fabricate two or more devices 303C at a time. The dispenser/probe head 304 C may be mounted to a control arm 305C to facilitate scanning of a substrate 301C on a stage 302C. The linear arrays of dispenser units may be configured with each dispenser unit in the array aligned with a different column of devices (say in the X-direction) in the array of devices while the probe arm scans the probe array along the rows of devices (say in the Y-direction). If the number of dispensers in the array is equal to or greater than the number of columns of devices in the device array, the apparatus 300 may simultaneously fabricate all the devices in one column 307C of a device array. Furthermore, such an apparatus may fabricate all of the devices in the device array in a single pass with the dispenser/probe head 304C. The dispenser arrays may be replaced with one or probe arrays 320C to simultaneously test entire columns of devices.

The dispenser testing head 304 may also receive one or more testing probe units 321, 322, 323, which may be in the form of replaceable cartridges. Each probe unit may include a probe coupled to a testing module having features in common with those described above with respect to the probe 104 shown in FIGS. 1A-1B. Each of the probes 321, 322, 323 may test a different operating parameter of the device, or individual layer of an individual device. Thus, in a single pass, the apparatus 300 may characterize three different properties for a whole row of devices. The apparatus 300 may swap the testing dispenser units for the testing units in a manner like that of an X-Y plotter switching pens. Thus, the apparatus 300 may both fabricate and test an entire array of devices.

It will be understood by those of skill in the art that the foregoing discussions directed to the various delivery techniques, synthetic routes, screening methods, etc. are fully applicable to the above embodiments of the present invention. Furthermore, those of skill in the art will recognize that the apparatus 300 may be used for fabrication of arrays of optoelectronic devices that may be subsequently tested with a different apparatus or for testing of optoelectronic devices that have been previously fabricated with a different apparatus. As such, the apparatus 300 may be used solely for optoelectronic device fabrication or solely for optoelectronic device testing. Furthermore, the apparatus 300 may be used for some combination of completion of partially fabricated optoelectronic devices and/or testing of partially tested devices.

IX. EXAMPLES

By way of example, the parallel device synthesis method described herein may make use of an apparatus capable of holding up to 384 samples at uniquely addressable positions within a fabrication array. At each position within the array, a substrate is held stable with two or more clamps providing both for electrical contact with the device and for mechanical stability during fabrication and testing. The substrate is typically a flexible transparent substrate comprised of a plastic film, metal film or textile, coated with a transparent electrical conductor such as Indium Tin Oxide (ITO). By way of example, each sample could be a device in the form of a porous film into which a light-absorbing material has been deposited. The absorbance of this film can be measured in a spectrophotometer and compared with a reference sample (e.g. porous film without any deposited material), and the resulting values normalized for z-axis thickness (e.g. using a mechanical profilometer to measure thickness).

The techniques outlined herein are particularly suitable for rapid development of organic, inorganic and hybrid solar cells since they may be manufactured by non-vacuum deposition techniques. Silicon-based solar cells, by contrast are typically manufactured using vacuum deposition techniques that are not compatible with rapid combinatorial fabrication as described herein.

Figure 4A:
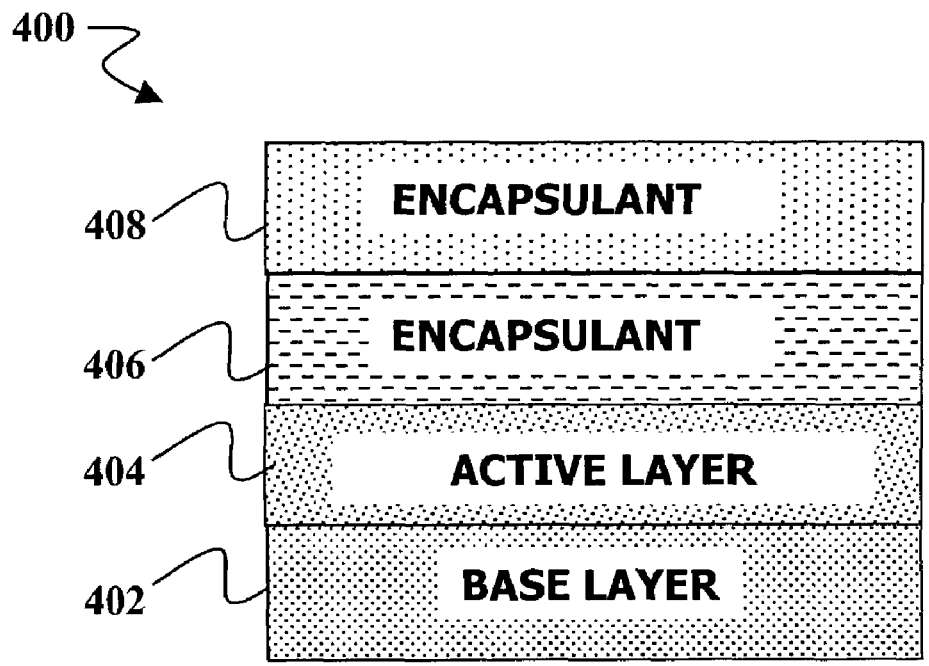
FIGS. 4A-4F show examples of the material composition and architecture of solar cell devices that may be fabricated in accordance with embodiments of the present invention.

FIGS. 4A-4F show examples of the material composition and architecture of optoelectronic devices that may be fabricated by a parallel synthesis method. FIG. 4A shows a solar cell device 400. The device 400 is typically built upon a base layer 402 made, e.g., from a suitable polymer such as Kapton®. The base layer 402 may be the same as or different from the substrate described above. An active layer 404 is disposed on the substrate layer 402 and encapsulated by one or more encapsulating layers 406, 408, such as ethylene vinyl acetate (EVA) and or Tefzel®. Kapton® and Tefzel® are registered trademarks of E. I. Du Pont De Nemours and Company Corporation of Wilmington Del. Each of the layers in the device 400 can be optimized to improve device performance parameters such as efficiency, stability and cost. In particular, the specific conducting polymers, organothethoxysilanes or other silanes or polysilanes, metallic components, transparent conducting electrodes, encapsulants, sealing agents, and chemically inert atmospheres used for device fabrication can all be altered, modulated, and mixed to optimize device performance as described above. Further, at one level of structural resolution within the device, the thickness of each layer, the number of layers, the order of the layers, the aspect ratio of the device can be changed to potentially improve device function. At a different level of structural resolution within the device, the chemical composition of each layer, the nano-scale architecture of that layer, the porosity of that layer, the pore size, shape, length, and diameter, and the pore interconnectivity can be changed to potentially improve device function. In addition, the addition of dopants, dyes, photochemically-active compounds, and other materials can be introduced into any or all of the layers and/or materials within the device. Each of these additions provides the potential for functional improvement of the device.

Figure 4B:
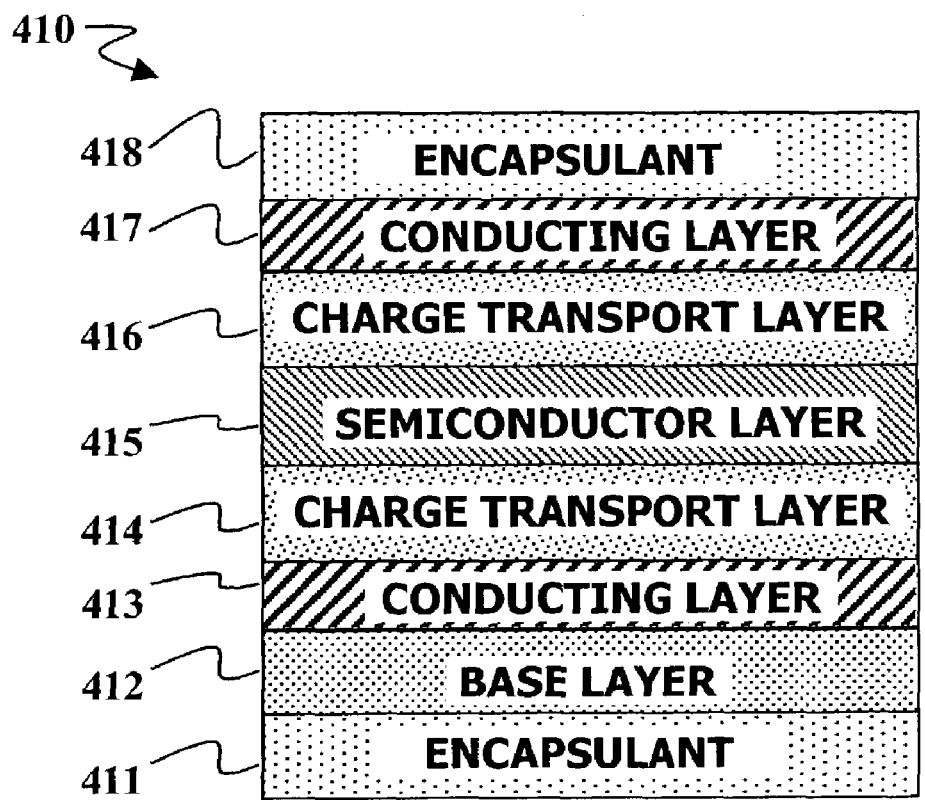

A more detailed example of an optoelectronic device 410 is shown in FIG. 4B. The device 410 includes an optional base layer 412, first and second conducting layers 413, 417, optional first and second charge transport layers 414, 416, a semiconductor or semiconductor blend layer 415, and optional first and second encapsulants 411, 418. The semiconductor/blend layer 415, which may be 30 nm to 100 µm thick, is disposed between the first and second charge transport layers 414, 416, which may be 0 to 500 nm thick. The charge transport layers 414, 416 and semiconductor/blend layer 415 are disposed between the first and second conducting layers 413, 417, which may be between 5 nm and 100 µm thick. The first conducting layer 413, which may be transparent, is typically disposed between the semiconductor/blend layer 415 and the base layer 412. In the particular example shown in FIG. 4B, the first conducting layer 413 is disposed between the first charge transport layer 414 and the base layer 412 with the charge transport layer disposed between the semiconductor/blend layer 415 and the first conducting layer 413. The substrate 412 may be a polymer such as PET.

Figure 4C:
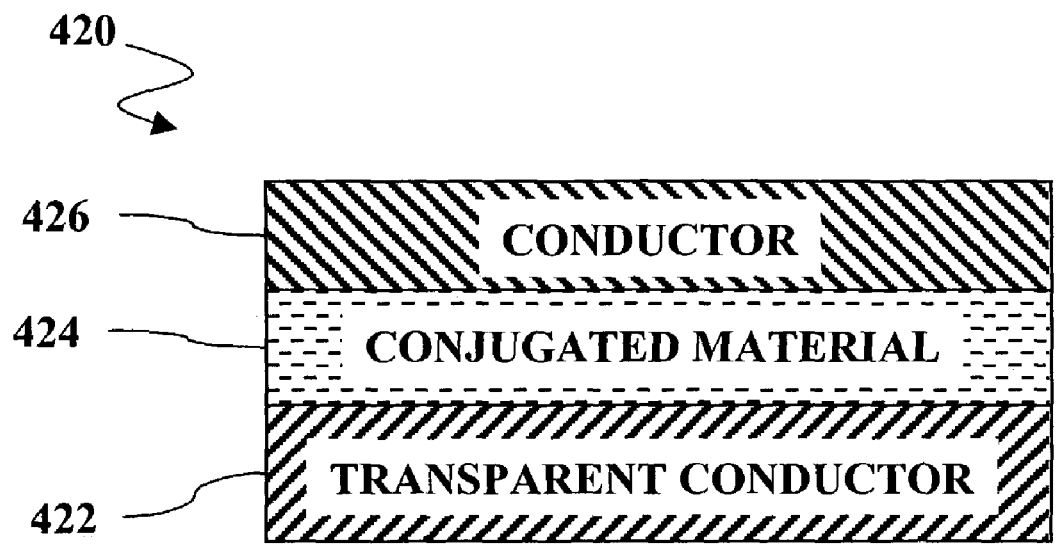

Many variations are possible on the optoelectronic device shown in FIGS. 4A-4B. FIG. 4C depicts one such variation in the form of a single-layer optoelectronic device 420. The single-layer optoelectronic device 420, which may be a solar cell or LED, generally includes a layer of conjugated material 424 disposed between a first conductor layer 422, which is transparent, and a second conductor layer 426 which may be transparent or non-transparent. The conjugated material may be a conjugated polymer or dye. Alternatively, the layer of conjugated material 424 may include a blend of two or more conjugated polymers or dyes or pigments, possibly including inorganic compounds or non-conjugated compounds.

Figure 4D:
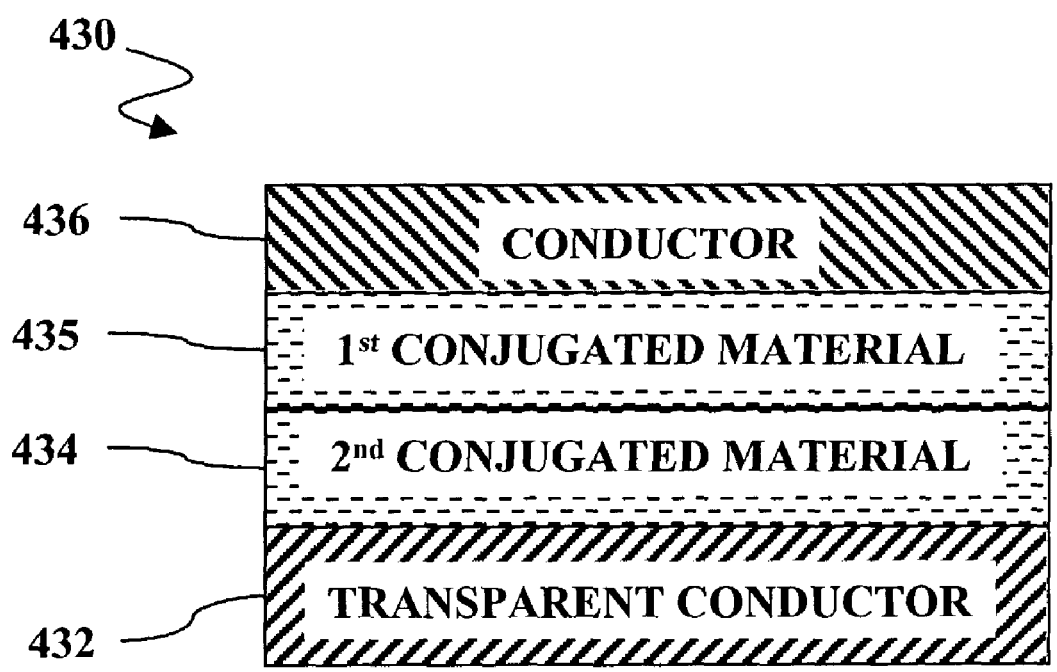
Figure 4E:
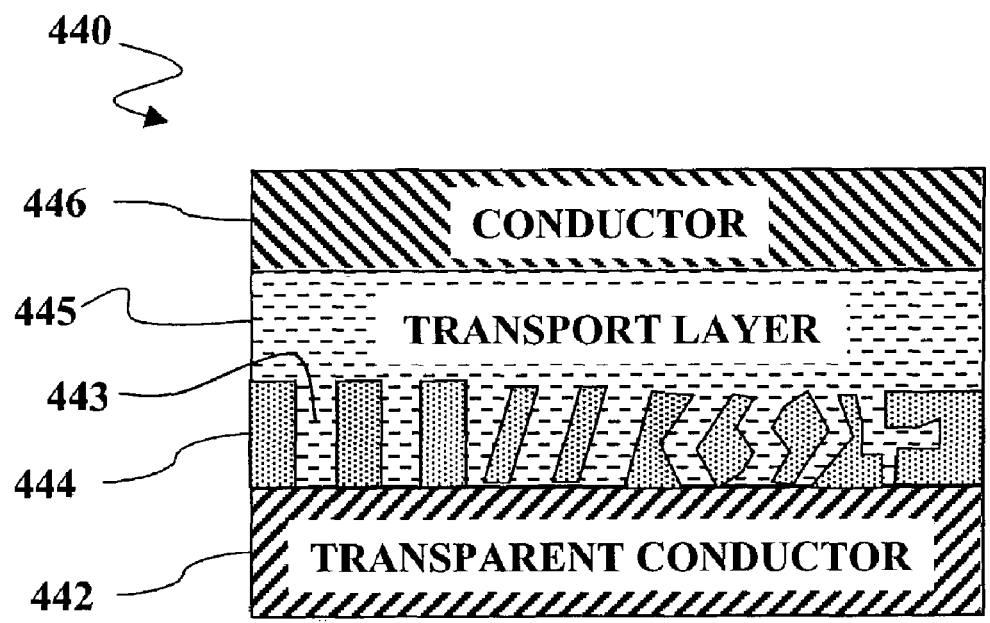
Figure 4F:
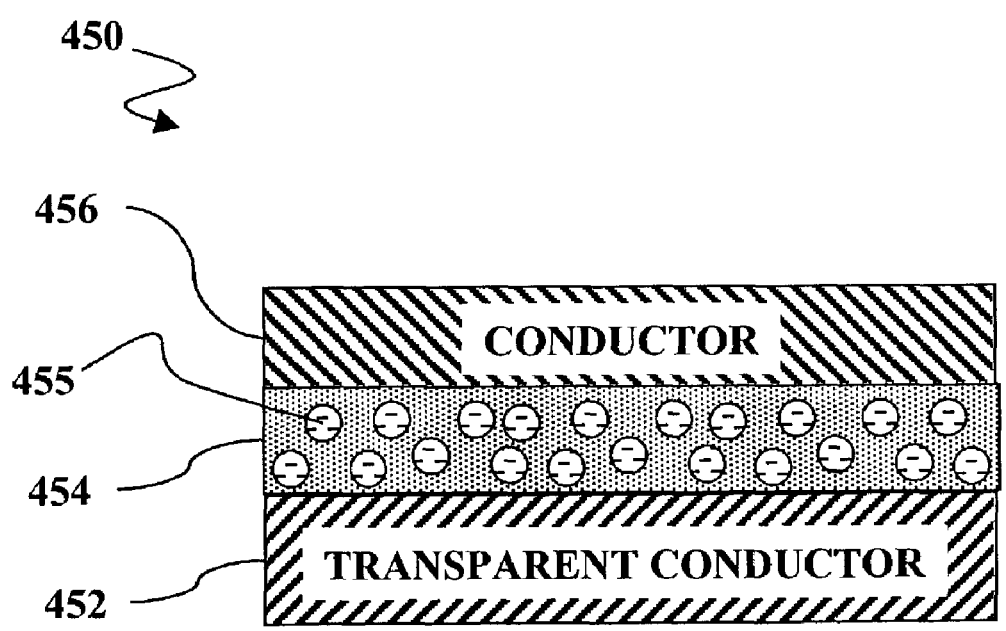

Additional variations on the device 420 of FIG. 4C are shown in FIGS. 4D-4F. For example, FIG. 4D depicts a double layer optoelectronic device 430 having first and second layers of conjugated material 434, 435 disposed between first and second conducting layers 432, 436, at least one of which is transparent. The first and second layers of conjugated material 434, 435 may include different compounds, e.g. a different conjugated polymer or dye in each layer or different combinations of two or more of the same conjugated polymers or dyes in each layer.

FIG. 4E depicts an optoelectronic device 440 in which a mesoporous matrix 444 and charge transport layer 445 are disposed between first and second conducting layers 442, 446, at least one of which is transparent. The mesoporous matrix includes pores 443 that communicate with the charge transport layer 445. The charge transport layer 445 may allow for the transport of electric charge in the form of electrons or holes. Alternatively, the charge transport layer 445 may include an electrolyte that allows for the transport of electric charge in the form of ions. The charge transport layer may include one or more conducting components, e.g. in the form of metals, or semiconducting components, e.g., in the form of one or more conjugated polymers or dyes. The material of the charge transport layer 445 fills the pores 443 in the mesoporous matrix 444. The pores 443 in the mesoporous matrix 444 may be in the form of cylindrical or non-cylindrical vacancies typically between 1 nm and 100 nm in size. The pores 443 may be oriented vertically, i.e., perpendicular, with respect to the plane of the mesoporous matrix 444 or the may be oriented obliquely. Furthermore, the pores 443 may have any arbitrary shape or cross-section and may be distributed either uniformly or randomly within the plane of the mesoporous matrix 444. The material of the mesoporous matrix 444 may be a conducting, semiconducting or insulating material. Some examples, among others, of suitable conducting materials for the mesoporous matrix 444 include metals and alloys. Some examples, among others, of suitable semiconducting materials for the mesoporous matrix 444 include CdSe, CdTe, $TiO_2$, $C_{60}$ perylene dyes and conjugated polymers. Some examples, among others, of suitable insulating materials for the mesoporous matrix 444 include polysilane, latex, glass, ceramics, polymers and the like.

In a variation on the optoelectronic device 440 of FIG. 4E, depicted in FIG. 4F an optoelectronic device 450 may include a mesoporous matrix 454 in the form of particles 453 and a charge transport layer 455 that fills spaces between the particles 453. The mesoporous matrix 454 and charge transport layer 455 are disposed between first and second conducting layers 452, 546, at least one of which is transparent. The particles 453 in the mesoporous matrix 454 may be in the form of spherical or non-spherical, e.g. rod-like particles typically between 1 nm and 100 nm in size. The particles 453 may be made from insulating, semiconducting, or conducting materials. Examples of insulating materials include, among others, latex, polysilane, ceramics glass, ceramics, polymers and the like. Examples of semiconducting materials include, among others, $TiO_2$, $SnO_2$, CdSe, CdTe, organic semiconductors such as fullerenes (C60) perylene dyes and conjugated polymers. Examples of conducting materials include, among others, metals, alloys and conducting polymers.

Figure 5:
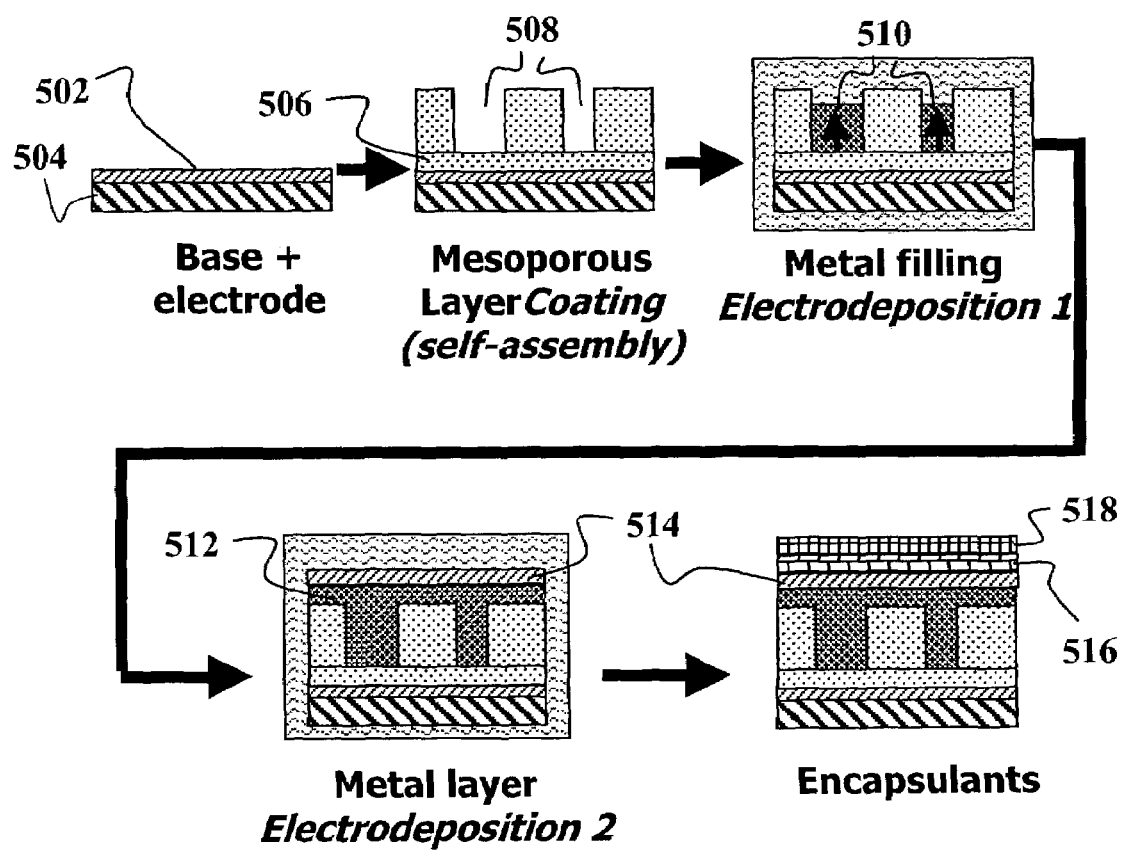
FIG. 5 shows an example of the serial deposition, fabrication and processing steps required to make a solar cell device according to an embodiment of the present invention.

There are many ways of fabricating devices of the type shown in FIGS. 4A-4F. For example, as shown in FIG. 5, a solar cell device can be constructed by co-depositing or co-polymerizing a conducting polymer film and an organoethoxysilane micture upon a substrate 502 previously coated with a transparent conducting electrode 504 such as Indium Tin Oxide (ITO). Upon deposition, a mesoporous conducting film 506 can be formed with equally spaced and sized pores 508 present throughout the film. Electrodeposition can be carried out on the mesoporous film 506 to deposit a conducting material 510 into the pores 508, forming an interdigitated, interpenetrating network of columnar conducting components arrayed amongst a medium of conducting, semiconducting or insulating polymer material. The conducting material 510 may be another conducting polymer or a metallic or semiconductor component. It is also possible to use the mesoporous film 506 as a template that may be etched away after the pores 508 have been filled with the conducting material 510. The filled pores may then be surrounded with another conducting, semiconducting or insulating material.

Another layer of a conducting polymer 512 can then be deposited or polymerized on top of the previous coating, after which a top electrode 514, e.g., comprised of Aluminum, Calcium, or another compound with a similar work function can be deposited onto the conducting polymer layer 512 to form a multi-layered structure 501. The multi-layered structure 501 can serve as the active layer of a solar cell device 500. The active layer (multilayered structure 501) may then be encapsulated in one or more layers of materials that provide both structural stability and minimize the potential impact of an adverse operating environment, e.g. to protect against exposure to oxygen, water, or dust particles. For example, such encapsulation can include lamination or sealing within a layer of ethylene vinyl acetate (EVA) 516 or other compound, which can serve to minimize the transmission of potentially destructive Ultra-Violet (UV) radiation into the device. In addition, the device 500 may be encapsulated with a layer of plastic film 518 that imparts strength to the device 500 in an operating environment. Device fabrication and encapsulation may be carried out in a chemically inert environment such as an Argon atmosphere to minimize potential oxidation reactions, potentially further improving the stability of the device.

A device of the type shown in FIG. 4 or FIG. 5 can be constructed at each addressable position in an array of the type shown in FIG. 1 by co-depositing or co-polymerizing in parallel a conducting polymer film and an organoethoxysilane micture upon the substrate at each addressable position in the array. The coating process can be carried out on one side of the device, creating a single cell solar device, or on both sides of a substrate, creating a tandem-cell solar device. The coating process can be based on dip-coating, spay coating, spin coating, electrodeposition, electropolymerization, inkjet printing, web coating and/or chemical bath deposition.

Upon formation of a mesoporous conducting film with equally spaced and sized pores present throughout the film in each sample, electrodeposition can then be carried out in parallel on all devices to deposit either another conducting polymer or a metallic component into the pores, forming an interdigitated, interpenetrating network of columnar metallic or conducting, semiconducting or insulating polymer components arrayed amongst a medium of conducting, semiconducting or insulating polymer material within each device in each sample holder.

An additional layer of a conducting polymer can then be deposited, co-deposited, or polymerized in parallel on top of the previous coating for each device in each sample holder.

A top electrode coating comprised of Aluminum, Calcium, or another compound with a similar work function can then be deposited in parallel onto each device in each sample holder. This multi-layered structure can serve as the active layer of a solar cell device. Each device may be provided with a separate electrode. It may be desirable to vary the electrode material, thickness, or other parameters such as deposition speed.

For optoelectronic measurements of non-encapsulated devices, an additional electrode can be attached to each device in each sample holder, permitting the measurement of electrical resistance and/or conductivity through each non-encapsulated device, either with an applied voltage or an applied current, under either dark (e.g. no light or light intensity below some threshold) or light (e.g. in the presence of either monochromatic light of specific wavelength, intensity, and duration, or polychromatic light of specific intensity and duration) conditions.

For optoelectronic measurements of encapsulated devices, an additional electrode can be attached to each device in each sample holder, and the active layer of each device in each sample holder can be encapsulated within materials that provide both structural stability and minimize the potential impact of an adverse operating environment. Encapsulation is carried out in parallel for each device in each sample holder and can include lamination or sealing within a layer of ethylene vinyl acetate (EVA) or other compound, which can serve to minimize the transmission of potentially destructive Ultra-Violet (UV) radiation into the device, as well as encapsulation with plastic films that impart strength to the film in an operating environment. Device fabrication and encapsulation can be carried out in a chemically inert environment such as an Argon atmosphere to minimize potential oxidation reactions, potentially further improving the stability of the device. The presence of the additional electrode permits the measurement of electrical resistance and/or conductivity through each encapsulated device, either with an applied voltage or an applied current, under either dark (e.g. no radiation) or light (e.g. in the presence of either monochromatic light of specific wavelength, intensity, and duration, or polychromatic light of specific intensity and duration) conditions.

Once fabricated, a set of solar cell devices can be tested by a parallel optoelectronic measurement apparatus, e.g., as show in FIGS. 1A-1B, in which a radiation source is used to illuminate all or part of the each of the solar cell devices, either in parallel or in series, and the electrical properties of each device are measured, e.g. via electrodes or a suitable probe, recorded, and stored in a software-based database in relation to the position of each solar cell device on the addressable sample holding solar cell array.

For each solar cell device on the addressable sample holding solar cell array, information on the composition of matter, materials, and device architecture is recorded in the database, and this structural integration is integrated with the functional dark and light optoelectronic measurements made for each solar cell device. The database has a relational structure, permitting the mining of both low and high dimensional data and the recognition of patterns within the data, especially patterns related to the relationship of solar cell device structure and optoelectronic function.

The methods and apparatus within the scope of the present invention may be employed to optimize various result-effective parameters for solar cell devices, including efficiency, stability and cost. For solar cells of the type described above result-effective parameters include the type and composition of a semiconductor used in the photoelectric layer. Such metals may include e.g., CdSe, CuInSe$_2$, CdTe, C60 conjugated polar dyes, perylene, etc. The morphology, e.g., size, aspect ratio, etc. of the nanostructures in the photoelectric layer is another result-effective parameter. Other result-effective parameters involving the photoelectric layer include cell morphology, architecture (e.g., packing, crystal structure), the presence and composition of photosensitizers, (e.g., Ru-polypyridyl complexes), the presence and concentration of one or more dopants such as Iodine, Lithium, PAN-AMPSA. Properties of the base layer such as thickness, size, aspect ratio may also be result-effective parameters. With regard to the encapsulating and/or base layers the presence and composition of coatings such as conjugated polymers may be result-effective parameters. A conjugated polymer is a semiconducting polymer, e.g. of the type:

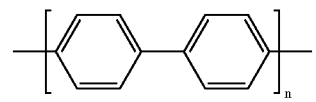

having alternating single and double bonds. By contrast, polymers of the type

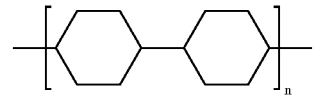

tend to be insulating polymers. Dyes may be conjugated but have not repeat units. Conjugation usually results in absorption of visible light. In addition, the composition and processing of organic materials used in one or more of the layers of a solar cell device (e.g., polymers such as P3HT, Polypyrrole, PolyAniline, Pedot) may be result-effective parameters that can be optimized using the techniques described herein.

A sample holder containing a set of solar cell devices can then be stored and the measurements and analyses described above can be repeated as a function of time, environmental exposure, or other parameter, to permit analysis of the stability of the devices.

X. CONCLUSION

The present invention provides greatly improved methods and apparatus for the parallel deposition, synthesis and screening of an array of optoelectronic devices on a single substrate. It is to be understood that the above description is intended to be illustrative and not restrictive. Many embodiments and variations of the invention will become apparent to those of skill in the art upon review of this disclosure. Merely by way of example a wide variety of process times, reaction temperatures and other reaction conditions may be utilized, as well as a different ordering of certain processing steps. The scope of the invention should, therefore, be determined not with reference to the above description, but instead should be determined with reference to the appended claims along with the full scope of equivalents to which such claims are entitled.

The invention claimed is:

1. A method comprising:
   forming a plurality of optoelectronic devices, wherein forming comprises depositing particles of a precursor material in a precursor layer, and reacting the precursor material in one or more steps to form a photovoltaic active layer comprised of an inorganic semiconductor;
   wherein each optoelectronic device is located in an array at a uniquely addressable position in the array;
   wherein forming further comprises independently controlling reaction conditions at each uniquely addressable position.

2. The method of claim 1 wherein at least one result effective parameter is different for two or more optoelectronic devices in the array.

3. The method of claim 1 wherein each of the optoelectronic devices in the array is a photovoltaic device.

4. The method of claim 3 wherein an optoelectronic device is formed at each addressable position by co-depositing or co-polymerizing in parallel a conducting, semiconducting or insulating polymer film upon the substrate at each addressable position in the array.

5. The method of claim 1 wherein each of the optoelectronic devices includes one or more layers of material.

6. The method of claim 5 wherein each layer of each device is formed by one or more techniques chosen from spray coating, spin coating, dip coating, and draining, flow coating, roller coating, pressure-curtain coating, doctor blade coating, brushing, sublimation, condensation, chemical bath deposition, lamination, electrodeposition, electropolymerization, web coating, vacuum deposition, sputter, and laser ablation.

7. The method of claim 1 wherein the area of the substrate upon which each optoelectronic device is formed is between about 10 µm$^2$ and about 25 cm$^2$.

8. The method of claim 1 wherein the area upon which each optoelectronic device is formed is between about 75 mm$^2$ and about 100 mm$^2$.

9. The method of claim 1 wherein the area upon which each optoelectronic device is formed is smaller than about 5 cm$^2$.

10. The method of claim 1 wherein the area upon which each optoelectronic device is formed is smaller than about 1 cm$^2$.

11. The method of claim 1 wherein the area upon which each optoelectronic device is formed is smaller than about 1 mm$^2$.

12. The method of claim 1 wherein the area upon which each optoelectronic device is formed is smaller than about 0.5 mm$^2$.

13. The method of claim 1 wherein the area upon which each optoelectronic device is formed is smaller than about 10,000 µm$^2$.

14. The method of claim 1 wherein the area upon which each optoelectronic device is formed is smaller than about 1,000 µm$^2$.

15. The method of claim 1 wherein the area upon which each optoelectronic device is formed is smaller than about 100 µm$^2$.

16. The method of claim 1 wherein the area upon which each optoelectronic device is formed is smaller than about 10 µm$^2$.

17. The method of claim 1 wherein the step of forming on a substrate an array containing a plurality of optoelectronic devices includes forming at least 10 different devices on a single substrate.

18. The method of claim 1 wherein the step of forming on a substrate an array containing a plurality of optoelectronic devices includes forming between at least 10 and about 106 different devices on a single substrate.

19. The method of claim 1 wherein density of regions per unit area is between about 0.04 regions/cm$^2$, and about 100 regions/cm$^2$.

20. The method of claim 19 wherein the density of regions per unit area is between about 1 region/cm$^2$, and about 1.5 regions/cm$^2$.

21. The method of claim 1 wherein the step of forming on a substrate an array containing a plurality of optoelectronic devices includes forming one or more layers on the substrate using a dispenser.

22. The method of claim 21 wherein forming one or more layers on the substrate using a dispenser includes keeping the substrate substantially fixed while moving dispenser with respect to the substrate.

23. The method of claim 21 wherein forming one or more layers on the substrate using a dispenser includes keeping the dispenser substantially fixed while moving the substrate with respect to the dispenser.

24. The method of claim 21, wherein the step of forming on a substrate an array containing a plurality of optoelectronic devices includes forming one or more rows of fully or partially complete optoelectronic devices in a single pass with the dispenser.

25. The method of claim 24 wherein the dispenser dispenses droplets of between about 0.5 microliters and about 1 microliter in volume.

26. The method of claim 25 wherein each droplet spreads out on the substrate to a diameter of between about 5 mm and about 15 mm.

27. The method of claim 26 wherein 20 droplets are dispensed onto the substrate, wherein the substrate has dimensions of about 15 cm by about 10 cm.

28. The method of claim 1 wherein the inorganic semiconductor comprises a copper-based alloy.

29. The method of claim 1 wherein the inorganic semiconductor comprises a group IB-IIIA-VIA material.

30. The method of claim 1 wherein the inorganic semiconductor comprises $CuInSe_2$.

31. The method of claim 1 wherein independently controlling reaction conditions comprises varying at least one of the following from at each uniquely addressable position: reactant and/or deposition amounts, reactant and/or deposition solvents, reaction and/or deposition temperatures, reaction and/or deposition times, rates at which the reactions or depositions are quenched, deposition order of reactants, solvent concentration, reactant concentration, presence and concentration of dopants and/or catalysts.

32. The method of claim 1 further comprising varying at least one of the following reaction parameters: reactant amounts, reactant solvents, solvent concentrations, presence and concentration of catalysts, presence and concentration of dopants, reaction temperatures, reaction times, the pressures at which the reactions are carried out, the atmospheres in which the reactions are conducted, the rates at which the reactions are quenched, or the order in which the reactants are deposited.

* * * * *